US012123788B2

(12) United States Patent
Li et al.

(10) Patent No.: US 12,123,788 B2
(45) Date of Patent: Oct. 22, 2024

(54) TEMPERATURE MEASUREMENT CIRCUIT, TEMPERATURE AND LIGHT INTENSITY MEASUREMENT CIRCUIT, TEMPERATURE MEASUREMENT METHOD AND TEMPERATURE AND LIGHT INTENSITY MEASUREMENT METHOD

(71) Applicant: SHENZHEN GOODIX TECHNOLOGY CO., LTD., Shenzhen (CN)

(72) Inventors: Chuanlin Li, Shenzhen (CN); Fulin Li, Shenzhen (CN); Haixiang Wang, Shenzhen (CN)

( * ) Notice: Subject to any disclaimer, the term of this patent is extended or adjusted under 35 U.S.C. 154(b) by 481 days.

(21) Appl. No.: 17/498,219

(22) Filed: Oct. 11, 2021

(65) Prior Publication Data

US 2022/0065709 A1    Mar. 3, 2022

Related U.S. Application Data

(63) Continuation of application No. PCT/CN2020/111123, filed on Aug. 25, 2020.

(51) Int. Cl.
*G01K 7/24* (2006.01)
*H03F 3/45* (2006.01)

(52) U.S. Cl.
CPC .......... *G01K 7/24* (2013.01); *H03F 3/45475* (2013.01)

(58) Field of Classification Search
None
See application file for complete search history.

(56) References Cited

U.S. PATENT DOCUMENTS 7,108,420 B1    9/2006  Schnaitter
7,741,983 B1 *  6/2010  Lakshmikanthan .........
                                               G01R 19/0092
                                                      341/120

(Continued)

FOREIGN PATENT DOCUMENTS

CN         1159225 A     9/1997
CN       203657932 U     6/2014

(Continued)

OTHER PUBLICATIONS

International Search Report for PCT/CN2020/111123.

(Continued)

*Primary Examiner* — Erica S Lin
(74) *Attorney, Agent, or Firm* — Nasr Patent Law LLC; Faisal K. Abou-Nasr

(57) ABSTRACT

The present disclosure relates to the field of biometric parameter measurement, and in particular, to a temperature measurement circuit, a temperature measurement method, a temperature and light intensity measurement circuit, a temperature and light intensity measurement method, a chip, a module, and an electronic device. A temperature signal is obtained based on an output voltage of a differential amplifier circuit when a non-inverting input terminal of the differential amplifier circuit is unload, an output voltage of the differential amplifier circuit when the non-inverting input terminal of the differential amplifier circuit is connected to a calibration resistor, and the output voltage of the differential amplifier circuit when the non-inverting input terminal of the differential amplifier circuit is connected to a thermistor, which improves the accuracy of the temperature measurement.

20 Claims, 8 Drawing Sheets

(56) References Cited

U.S. PATENT DOCUMENTS

| | | | |
|---|---|---|---|
| 8,197,123 B2 | 6/2012 | Snyder et al. | |
| 2017/0142802 A1* | 5/2017 | Bowers | H05B 45/20 |
| 2017/0146633 A1 | 5/2017 | Das et al. | |
| 2017/0307718 A1* | 10/2017 | Timmons | G01R 15/04 |

FOREIGN PATENT DOCUMENTS

| | | |
|---|---|---|
| CN | 104501986 A | 4/2015 |
| CN | 205262632 U | 5/2016 |
| CN | 207703359 U | 8/2018 |
| EP | 3617672 A1 | 3/2020 |
| JP | 2002086779 A | 3/2002 |

OTHER PUBLICATIONS

Supplementary European Search Report for European App. No. 20929678.9 dated May 3, 2022.
"Request for the Submission of an Opinion" mailed on Nov. 14, 2023 for Korean Patent Application No. 10-2021-7036294.

* cited by examiner

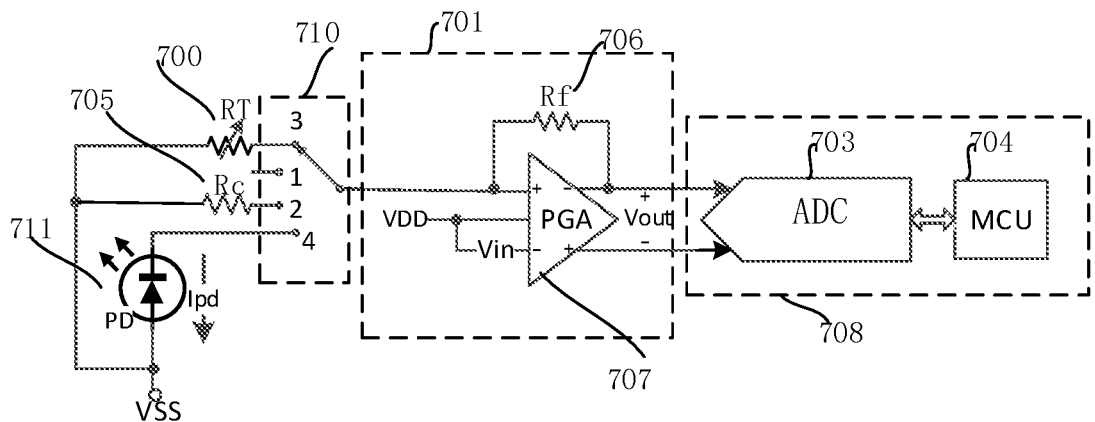
FIG. 7A
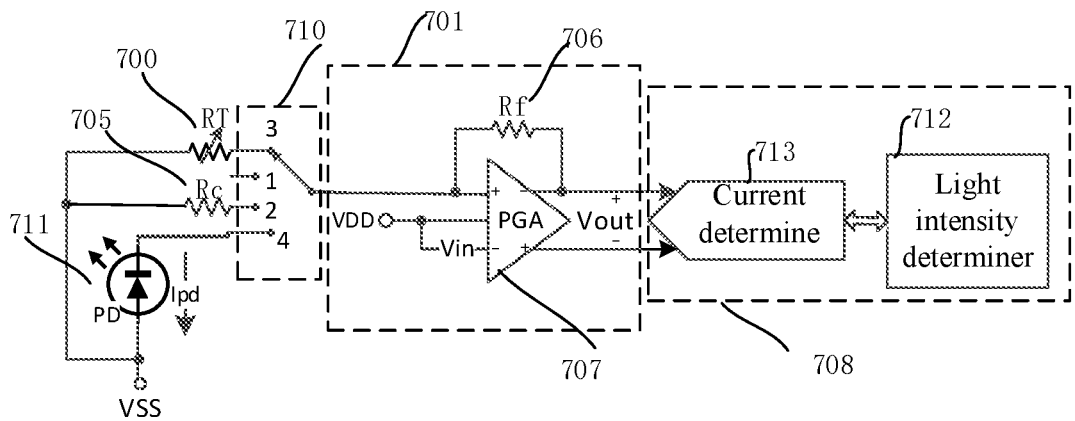
FIG. 7B
| During a fourth period, connecting a non-inverting input terminal of a differential amplifier to a front stage of a photodiode in such a manner that a differential amplifier circuit outputs a fourth output voltage during the fourth period | S801 |
|---|---|
↓
| Outputting a light intensity signal by a conversion circuit based on the fourth output voltage | S802 |
|---|---|
FIG. 8
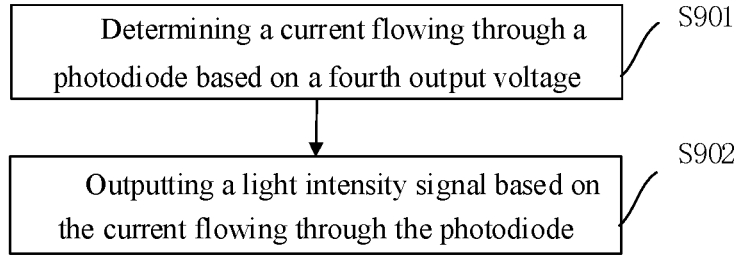
FIG. 9

| Unloading a non-inverting input terminal of a differential amplifier circuit, or connecting the non-inverting input terminal of the differential amplifier circuit to a thermistor or a calibration resistor | S1001 |

↓

| Obtaining, by a conversion circuit, a temperature signal of the measured object based on an output voltage when the non-inverting input terminal of the differential amplifier circuit is unload, an output voltage when the non-inverting input terminal of the differential amplifier circuit is connected to the thermistor, and an output voltage when the non-inverting input terminal of the differential amplifier circuit is connected to the calibration resistor | S1002 |

FIG. 10

| Determining a resistance of a thermistor based on an offset voltage, a calibration voltage, and a temperature measurement voltage | S1101 |

↓

| Determining a temperature of the measured object based on the resistance of the thermistor | S1102 |

FIG. 11

| Calculating a first difference and a second difference, where the first difference is a difference between a calibration voltage and an offset voltage, and the second difference is a difference between a temperature measurement voltage and the offset voltage | S1201 |

↓

| Calculating a first product that is a product of the first difference and a resistance of a calibration resistor | S1202 |

↓

| Calculating a resistance of the thermistor, where the resistance of the thermistor is the first product divided by the second difference | S1203 |

FIG. 12

| Performing an analog-to-digital conversion on each of an offset voltage, a calibration voltage, and a temperature measurement voltage | S1301 |

↓

| Determining a resistance of a thermistor based on the analog-to-digital converted offset voltage, the analog-to-digital converted calibration voltage, and the analog-to-digital converted temperature measurement voltage | S1302 |

FIG. 13

Unloading a non-inverting input terminal of the differential amplifier circuit, or connecting the non-inverting input terminal of the differential amplifier circuit to a thermistor, a calibration resistor, or a photodiode — S1401

Obtaining, by a conversion circuit, a temperature signal of a measured object based on an output voltage when the non-inverting input terminal of the differential amplifier circuit is unloaded, an output voltage when the non-inverting input terminal of the differential amplifier circuit is connected to the thermistor, and the output voltage when the non-inverting input terminal of the differential amplifier circuit is connected to the calibration resistor; and obtaining, by the conversion circuit, a light intensity signal of the measured object based on an output voltage when the non-inverting input terminal of the differential amplifier circuit is connected to the photodiode — S1402

FIG. 14

Determining a current flowing through a photodiode based on a light intensity measurement voltage — S1501

Determining light intensity based on the current flowing through the photodiode — S1502

FIG. 15

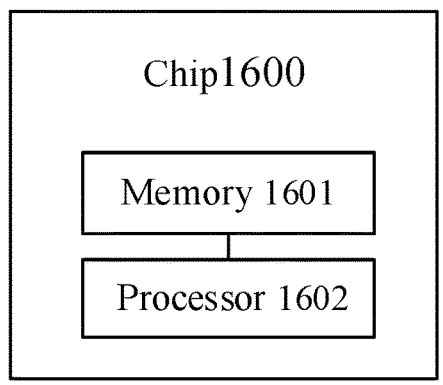

FIG. 16

TEMPERATURE MEASUREMENT CIRCUIT, TEMPERATURE AND LIGHT INTENSITY MEASUREMENT CIRCUIT, TEMPERATURE MEASUREMENT METHOD AND TEMPERATURE AND LIGHT INTENSITY MEASUREMENT METHOD

CROSS REFERENCE TO RELATED APPLICATIONS

The present application is a continuation of PCT Patent Application No. PCT/CN2020/111123, filed Aug. 25, 2020, which is incorporated by reference herein in its entirety.

TECHNICAL FIELD

This present disclosure relates to the field of biometric parameter measurement, and in particular, to a temperature measurement circuit, a temperature and light intensity measurement circuit, a temperature measurement method, and a temperature and light intensity measurement method.

BACKGROUND

With the increasing demand for biometric parameters, a traditional biometric parameter test has been gradually eliminated. For example, a mercury thermometer is not widely used due to environmental pollution and low test efficiency thereof, while an electronic thermometer is widely used. In the related art, when a thermistor is used to measure temperature, it may have a larger measurement error. For example, due to an unstable power supply voltage or an offset voltage, a calculated resistance of the thermistor is inaccurate, which may result in the larger measurement error.

SUMMARY

In view of the larger measurement error in the related art, embodiments of the present disclosure provide a temperature measurement circuit, a temperature and light intensity measurement circuit, a temperature measurement method, a temperature and light intensity measurement method, a chip, a module, and an electronic device.

In a first aspect, an embodiment of the present disclosure provides a temperature measurement circuit including a differential amplifier circuit and a conversion circuit. A non-inverting input terminal of the differential amplifier circuit is unloaded, or connected to a thermistor or a calibration resistor, and the thermistor is configured to convert a temperature signal of a measured object to a resistance signal. The differential amplifier circuit is configured to output an offset voltage when the non-inverting input terminal of the differential amplifier circuit is unloaded, to output a calibration voltage when the non-inverting input terminal of the differential amplifier circuit is connected to the calibration resistor, and to output a temperature measurement voltage of the measured object when the non-inverting input terminal of the differential amplifier circuit is connected to the thermistor. The differential amplifier circuit is connected to the conversion circuit. The conversion circuit is configured to obtain the temperature signal of the measured object based on the offset voltage, the calibration voltage, and the temperature measurement voltage.

According to the first aspect, in an embodiment, the conversion circuit includes a first resistance determiner and a first temperature determiner that are connected to each other; the first resistance determiner is configured to output a resistance signal of the thermistor based on the offset voltage, the calibration voltage, and the temperature measurement voltage; and the first temperature determiner is configured to convert the resistance signal to the temperature signal.

According to the first aspect, in an embodiment, the first resistance determiner includes a first subtractor, a first multiplier, and a first divider; the first subtractor is configured to calculate a first difference and a second difference, the first difference being a difference between the calibration voltage and the offset voltage, and the second difference being a difference between the temperature measurement voltage and the offset voltage; the first multiplier is configured to calculate a first product which is a product of the first difference and a resistance of the calibration resistor; and the first divider is configured to calculate the resistance signal which is a quotient of the first product divided by the second difference.

According to the first aspect, in an embodiment, the conversion circuit further includes a first analog-to-digital converter connected to the first resistance determiner and configured to convert the resistance signal to a digital resistance signal. The first analog-to-digital converter is connected to the first temperature determiner, and the first temperature determiner is further configured to convert the digital resistance signal to the temperature signal.

According to the first aspect, in an embodiment, the conversion circuit further includes a second analog-to-digital converter and a control circuit, the second analog-to-digital converter is configured to perform an analog-to-digital conversion on the offset voltage, the calibration voltage, and the temperature measurement voltage to obtain a digital offset voltage, a digital calibration voltage and a digital temperature measurement voltage, respectively; and the control circuit is connected to the second analog-to-digital converter and configured to convert the digital offset voltage, the digital calibration voltage, and the digital temperature measurement voltage to the temperature signal.

According to the first aspect, in an embodiment, the control circuit includes a second resistance determiner and a second temperature determiner, the second resistance determiner is configured to convert the digital offset voltage, the digital calibration voltage, and the digital temperature measurement voltage to a digital resistance signal of thermistor; and the second temperature determiner is connected to the second resistance determiner and configured to convert the digital resistance signal to the temperature signal.

According to the first aspect, in an embodiment, the second resistance determiner includes a second subtractor, a second multiplier, and a second divider, the second subtractor is configured to calculate a third difference and a fourth difference, the third difference being a difference between the digital calibration voltage and the digital offset voltage, and the fourth difference being a difference between the digital temperature measurement voltage and the digital offset voltage; the second multiplier is configured to calculate a second product which is a product of the third difference and the resistance of the calibration resistor; and the second divider configured to calculate the digital resistance signal that is the second product divided by the fourth difference.

According to the first aspect, in an embodiment, the inverting input terminal of the differential amplifier circuit is connected to a first voltage, a second terminal of the thermistor is connected to a second voltage, and a second terminal of the calibration resistor is connected to the second voltage greater than or smaller than the first voltage.

According to the first aspect, in an embodiment, the differential amplifier circuit further includes a feedback resistor and a differential amplifier. The feedback resistor is a non-sensitive resistor, and two terminals of the feedback resistor are connected to a non-inverting input terminal and an inverting output terminal of the differential amplifier, respectively. The differential amplifier circuit is configured to output the offset voltage when the non-inverting input terminal of the differential amplifier is unloaded, to output the calibration voltage when the non-inverting input terminal of the differential amplifier is connected to a first terminal of calibration resistor, and to output the temperature measurement voltage when the non-inverting input terminal of the differential amplifier is connected to a first terminal of the thermistor.

According to the first aspect, in an embodiment, the resistance of the calibration resistor is greater than a product of twice the resistance of the feedback resistor and a first preset absolute value, the first preset absolute value being an absolute value of a quotient of a difference between the first voltage and the second voltage divided by a power supply voltage.

According to the first aspect, in an embodiment, a gain of the differential amplifier circuit is 0 when the non-inverting input terminal of the differential amplifier is unloaded; the gain of the differential amplifier circuit is twice the resistance of the feedback resistor divided by the resistance of the calibration resistor when the non-inverting input terminal of the differential amplifier is connected to the first terminal of the calibration resistor; and the gain of the differential amplifier circuit is twice the resistance of the feedback resistor divided by the resistance of the thermistor when the non-inverting input terminal of the differential amplifier is connected to the first terminal of the thermistor.

According to the first aspect, in an embodiment, the second voltage is a ground voltage, the first voltage is a common mode voltage, and a resistance of the feedback resistor is smaller than a resistance of the calibration resistor.

According to the first aspect, in an embodiment, the thermistor and the calibration resistor are connected to a switch circuit connected to the differential amplifier circuit, the switch circuit includes at least one switch unit in such a manner that the non-inverting input terminal of the differential amplifier circuit is unloaded, or is connect to a first terminal of the calibration resistor or a first terminal of the thermistor.

According to the first aspect, in an embodiment, the switch circuit comprises a first switch unit and a second switch unit. The non-inverting input terminal of the differential amplifier circuit is unloaded in such a manner that the differential amplifier circuit outputs the offset voltage when the first switch unit and the second switch unit are both in an OFF state. The non-inverting input terminal of the differential amplifier circuit is connected to the first terminal of the calibration resistor in such a manner that the differential amplifier circuit outputs the calibration voltage when the first switch unit is in an ON state. The non-inverting input terminal of the differential amplifier circuit is connected to the first terminal of the thermistor in such a manner that the differential amplifier circuit outputs the temperature measurement voltage when the second switch unit is in an ON state.

According to the first aspect, in an embodiment, the switch circuit is a one-of-three switch circuit configured to switch a connection state of the non-inverting input terminal of the differential amplifier circuit so that the non-inverting input terminal of the differential amplifier is unloaded or connected to the first terminal of the calibration resistor or the first terminal of the thermistor.

According to the first aspect, in an embodiment, the calibration resistor is a non-sensitive resistor, and the calibration resistor is a precision resistor, a temperature drift of the calibration resistor is smaller than or equal to 10 ppm/° C., and a precision of the calibration resistor is smaller than or equal to one thousandth.

According to the first aspect, in an embodiment, the differential amplifier circuit is a differential programmable gain amplifying circuit.

In a second aspect, an embodiment of the present disclosure provides a temperature and light intensity measurement circuit including the temperature measurement circuit as described in any one of embodiments of the first aspect. The non-inverting input terminal of the differential amplifier circuit is unloaded, or is connected to the thermistor, the calibration resistor or a photodiode. The photodiode is configured to convert a light intensity signal of the measured object to a current signal. The differential amplifier circuit outputs a light intensity measurement voltage when the non-inverting input terminal of the differential amplifier circuit is connected to the photodiode. The conversion circuit is further configured to obtain the light intensity signal of the measured object based on the light intensity measurement voltage.

According to the second aspect, in an embodiment, the non-inverting input terminal of the differential amplifier circuit is connected to a front stage of the photodiode when the non-inverting input terminal of the differential amplifier circuit is connected to the photodiode, and a rear stage of the photodiode is connected to a second voltage that is a ground voltage.

According to the second aspect, in an embodiment, the conversion circuit includes a current determiner and a light intensity determiner, the current determiner is configured to output a current signal passing through the photodiode based on the light intensity measurement voltage; and the light intensity determiner connected to the current determiner and configured to obtain the light intensity signal based on the current signal flowing through the photodiode.

According to the second aspect, in an embodiment, the current determiner includes a third divider configured to calculate the current signal, and the current signal is calculated by dividing the light intensity measurement voltage by twice the resistance of the feedback resistor of the differential amplifier circuit.

In a third aspect, an embodiment of the present disclosure provides a chip including the temperature measurement circuit as described in any one of embodiments of the first aspect or the temperature and light intensity measurement circuit as described in any one of embodiments of the second aspect.

In a fourth aspect, an embodiment of the present disclosure provides a module including a substrate, a thermistor, a calibration resistor, and the chip as described in the third aspect. The chip is connected to the substrate.

In a fifth aspect, an embodiment of the present disclosure provides an electronic device including a housing and the chip as described in the third aspect. The chip is disposed in the housing.

In a sixth aspect, an embodiment of the present disclosure provides a temperature measurement method applicable to a temperature measurement circuit which includes a differential amplifier circuit and a conversion circuit. The temperature measurement method includes: unloading a non-inverting input terminal of the differential amplifier circuit, or connecting the non-inverting input terminal of the differential amplifier circuit to a thermistor or a calibration resistor, the thermistor being configured to convert a temperature signal of a measured object to a resistance signal; and obtaining, by the conversion circuit, the temperature signal of the measured objected based on an output voltage when the non-inverting input terminal of the differential amplifier circuit is unloaded, an output voltage when the non-inverting input terminal of the differential amplifier circuit is connected to the thermistor, and an output voltage when the non-inverting input terminal of the differential amplifier circuit is connected to the calibration resistor.

According to the sixth aspect of the present disclosure, in an embodiment, the differential amplifier circuit is configured to output an offset voltage when the differential amplifier circuit is unloaded, to output a calibration voltage when the non-inverting input terminal of the differential amplifier circuit is connected to the calibration resistor, and to output a temperature measurement voltage when the non-inverting input terminal of the differential amplifier circuit is connected to the thermistor. The unloading the non-inverting input terminal of the differential amplifier circuit, or connecting the non-inverting input terminal of the differential amplifier circuit to the thermistor or the calibration resistor includes unloading the non-inverting input terminal of the differential amplifier circuit during a first period, connecting the non-inverting input terminal of the differential amplifier circuit to the calibration resistor during a second period, and connecting the non-inverting input terminal of the differential amplifier circuit to the thermistor during a third period. The conversion circuit is correspondingly configured to obtain the temperature signal of the measured object based on the offset voltage, the calibration voltage, and the temperature measurement voltage.

According to the sixth aspect of the present disclosure, in an embodiment, the first period, the second period and the third period are continuous in time; a sum of the first period, the second period and the third period is shorter than or equal to a first preset time duration; and the third period is longer than or equal to a second preset time duration.

According to the sixth aspect of the present disclosure, in an embodiment, the first preset time duration is set as 30 microseconds, and the second preset time duration is set as 1 microsecond.

According to the sixth aspect of the present disclosure, in an embodiment, a time duration of each of the first period, the second period, and the third period is shorter than or equal to 10 microseconds.

According to the sixth aspect of the present disclosure, in an embodiment, the first period is prior to the second period, and the second period is prior to the third period. In an embodiment, the second period is prior to the third period, and the third period is prior to the first period.

According to the sixth aspect of the present disclosure, in an embodiment, obtaining the temperature signal of the measured object based on the offset voltage, the calibration voltage, and the temperature measurement voltage includes determining a resistance of the thermistor based on the offset voltage, the calibration voltage, and the temperature measurement voltage, and determining a temperature of the measured object based on the resistance of the thermistor.

According to the sixth aspect of the present disclosure, in an embodiment, determining the resistance of the thermistor based on the offset voltage, the calibration voltage, and the temperature measurement voltage includes: calculating a first difference and a second difference, the first difference being a difference between the calibration voltage and the offset voltage, and the second difference being a difference between the temperature measurement voltage and the offset voltage value; calculating a first product that is a product of the first difference and a resistance of the calibration resistor; and calculating the resistance of the thermistor, the resistance of the thermistor being the first product divided by the second difference.

According to the sixth aspect of the present disclosure, in an embodiment, prior to determining the resistance of the thermistor based on the offset voltage, the calibration voltage, and the temperature measurement voltage, the method further includes performing an analog-to-digital conversion on each of the offset voltage, the calibration voltage, and the temperature measurement voltage, and determining the resistance of the thermistor correspondingly based on the analog-to-digital converted offset voltage, the analog-to-digital converted calibration voltage, and the analog-to-digital converted temperature measurement voltage.

According to the sixth aspect of the present disclosure, in an embodiment, the differential amplifier circuit further includes a feedback resistor and a differential amplifier. The feedback resistor is a non-sensitive resistor, and two terminals of the feedback resistor are connected to a non-inverting input terminal and an inverting output terminal of the differential amplifier, respectively. The resistance of the calibration resistor is set to be greater than a product of twice a resistance of the feedback resistor multiplied by a first preset absolute value that is an absolute value of a quotient of a difference between a first voltage and a second voltage divided by a supply source voltage. The inverting input terminal of the differential amplifier circuit is connected to the first voltage, a second terminal of the thermistor is connected to the second voltage, and a second terminal of the calibration resistor is connected to the second voltage.

According to the sixth aspect of the present disclosure, in an embodiment, a gain of the differential amplifier circuit is 0 when the non-inverting input terminal of the differential amplifier is unloaded. The gain of the differential amplifier circuit is twice the resistance of the feedback resistor divided by the resistance of the calibration resistor when the non-inverting input terminal of the differential amplifier is connected to the first terminal of the calibration resistor. The gain of the differential amplifier circuit is twice the resistance of the feedback resistor divided by the resistance of the thermistor when the non-inverting input terminal of the differential amplifier is connected to the first terminal of the thermistor.

According to the sixth aspect of the present disclosure, in an embodiment, the second voltage is a ground voltage, the first voltage is a common mode voltage, and the resistance of the feedback resistor is smaller than the resistance of the calibration resistor.

According to a seventh aspect, an embodiment of the present disclosure provides a temperature and light intensity measurement method applicable to a temperature and light intensity measurement circuit which includes a differential amplifier circuit and a conversion circuit, including unloading a non-inverting input terminal of the differential amplifier circuit, or connecting the non-inverting input terminal of the differential amplifier circuit to a thermistor, a calibration resistor or a photodiode, the thermistor being configured to convert a temperature signal of an object to be measured to a resistance signal, and the photodiode being configured to convert a light intensity signal of the measured object to a current signal; and obtaining, by the conversion circuit, the temperature signal of the measured objected based on an output voltage when the non-inverting input terminal of the differential amplifier circuit is unloaded, an output voltage when the non-inverting input terminal of the differential amplifier circuit is connected to the thermistor, and an output voltage when the non-inverting input terminal of the differential amplifier circuit is connected to the calibration resistor. The conversion circuit is further configured to obtain the light intensity signal of the measured object based on an output voltage when the non-inverting input terminal of the differential amplifier circuit is connected to the photodiode.

According to the seventh aspect of the present disclosure, in an embodiment, obtaining the light intensity signal of the measured object based on the output voltage when the non-inverting input terminal of the differential amplifier circuit is connected to the photodiode includes determining a current flowing through the photodiode based on a light intensity measurement voltage, and determining a light intensity based on the current flowing through the photodiode.

According to the seventh aspect of the present disclosure, in an embodiment, determining the current flowing through the photodiode based on the light intensity measurement voltage includes calculating the current flowing through the photodiode by dividing the light intensity measurement voltage by twice a resistance of the feedback resistor of the differential amplifier circuit.

In an eighth aspect, an embodiment of the present disclosure provides a chip, and the chip includes a memory configured to store program instructions, and a processor coupled with the memory and configured to call the program instructions that cause the chip to perform the temperature measurement method as described in any one of embodiments of the sixth aspect, or cause the chip to perform the temperature and light intensity measurement method as described in any one of embodiments of the seventh aspect.

Compared with the related art, in the temperature measurement circuit, the temperature measurement method, the temperature measurement and light measurement circuit, the temperature measurement and light measurement method, the chip, the module and, the electronic device, the temperature signal is obtained based on the output voltage of the differential amplifier circuit when the non-inverting input terminal of the differential amplifier circuit is unload, the output voltage of the differential amplifier circuit when the non-inverting input terminal of the differential amplifier circuit is connected to the calibration resistor, and the output voltage of the differential amplifier circuit when the non-inverting input terminal of the differential amplifier circuit is connected to the thermistor, which improves the accuracy of the temperature measurement in the related art.

BRIEF DESCRIPTION OF DRAWINGS

Accompanying drawings used in embodiments of the present disclosure will be briefly described hereafter in order to more clearly illustrate technical solutions of embodiments of the present disclosure or the related art. It should be understood that the accompanying drawings described below are merely some of, rather than all of the embodiments of the present disclosure. Other accompanying drawings may be obtained by those skilled in the art without any creative efforts based on these accompanying drawings.

FIG. 7A is a schematic diagram of a temperature and light intensity measurement circuit according to an embodiment of the present disclosure;

FIG. 7B is a schematic diagram of another temperature and light intensity measurement circuit according to an embodiment of the present disclosure;

FIG. 8 is a flowchart of a light intensity measurement method corresponding to the temperature and light intensity measurement circuit according to an embodiment of the present disclosure;

FIG. 9 is a flowchart of another light intensity measurement method corresponding to the temperature and light intensity measurement circuit according to an embodiment of the present disclosure;

FIG. 10 is a flowchart of a yet another temperature measurement method according to an embodiment of the present disclosure;

FIG. 11 is a flowchart of a still another temperature measurement method according to an embodiment of the present disclosure;

FIG. 12 is a flowchart of calculating a resistance of a thermistor according to an embodiment of the present disclosure;

FIG. 13 is a flowchart of a further another temperature measurement method according to an embodiment of the present disclosure;

FIG. 14 is a flowchart of a temperature and light intensity measurement method according to an embodiment of the present disclosure;

FIG. 15 is a flowchart of a light intensity measurement method according to an embodiment of the present disclosure; and FIG. 16 is a structural view of a chip according to an embodiment of the present disclosure.

DESCRIPTION OF EMBODIMENTS

Some of embodiments of the present disclosure will be described in detail hereinafter with reference to the accompanying drawings by way of example in order to make objects, technical solutions and advantageous of the present disclosure clearer. Those skilled in the art should understand that many technical details are provided in each example to better understand the present disclosure. However, it is appreciated that the technical solution claimed in this present disclosure can be realized even without these technical details and various changes and modifications based on the following embodiments.

Figure 1:
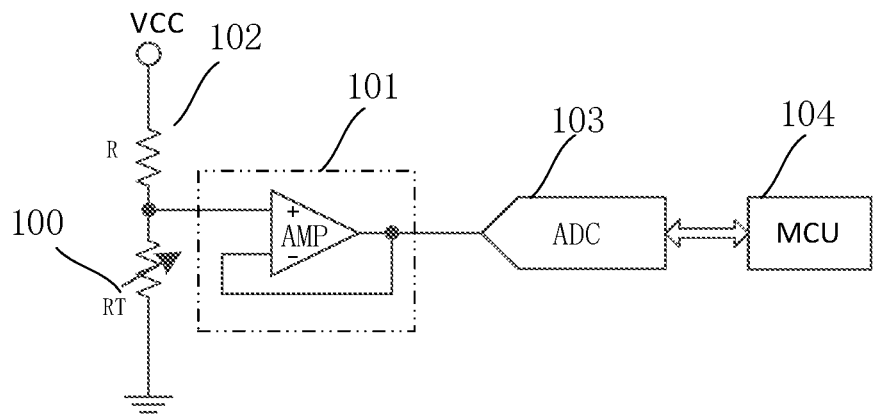
FIG. 1 is a schematic diagram of a temperature measurement circuit according to an embodiment of the present disclosure.

With reference to a temperature measurement circuit shown in FIG. 1, the temperature measurement circuit can be a resistive divider temperature measurement circuit, a sensitive resistor 100 is configured to measure temperature. Specifically, the sensitive resistor 100 can be a thermistor represented by RT. An amplifier circuit 101 includes an amplifier (AMP) including an inverting input terminal connected to an output terminal of the amplifier. A non-sensitive resistor 102 is represented by R. The non-sensitive resistor can be a resistor having a fixed resistance, or a resistor having an adjustable resistance. The non-sensitive resistor can be a resistor whose resistance hardly changes with environmental factors. A first terminal of the thermistor and a first terminal of the non-sensitive resistor are both connected to a non-inverting input terminal of the amplifier. A second terminal of the non-sensitive resistor is supplied with a supply voltage VCC, which can also be referred to as a power supply voltage, and a second terminal of the thermistor is connected to a ground voltage GND. An analog-to-digital converter circuit 103 is represented by ADC (Analog-to-Digital Converter). A controller circuit 104 is represented by MCU (Microcontroller Unit). The amplifier AMP can be an operational amplifier. For example, the amplifier can be a unity gain amplifier. The power supply voltage VCC is divided by the non-sensitive resistor 102 and the thermistor 100, and then is driven by the unity gain amplifier. Thereafter, the analog-to-digital converter ADC converts an output voltage Vout of the operational amplifier to a digital signal, and the controller circuit 104 digitally processes a digital signal to obtain a temperature signal. As can be seen from FIG. 1, a resistance of the thermistor can be expressed as: RT=Vout*R/(VCC−Vout). A circuit shown in FIG. 1 is simple. However, if the power supply voltage of the temperature measurement circuit is unstable, since a value of RT is directly related to VCC, the temperature measurement is likely to be inaccurate due to the unstable power supply voltage. In addition, due to an offset voltage of the amplifier circuit, the resistance of the thermistor can be calculated inaccurately, so that the temperature measurement is inaccurate. Also, due to environmental changes, such as temperature changes, the final calculated resistance of the thermistor can be inaccurate due to temperature drift of the power supply voltage VCC, the resistor R, or the offset voltage of the operational amplifier.

Figure 2:
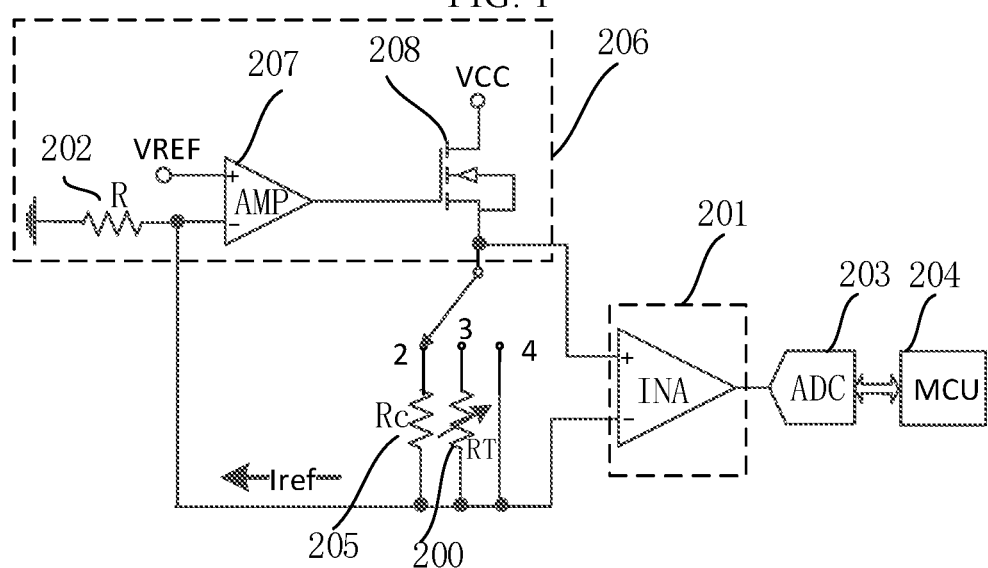
FIG. 2 is a schematic diagram of another temperature measurement circuit according to an embodiment of the present disclosure.

In view of the disclosure of the above embodiments, in this embodiment, the temperature measurement circuit shown in FIG. 2 can be referred to a constant current source driving temperature measurement circuit where a thermistor 200 is represented by RT and a calibration resistor 205 is represented by Rc and can be a non-sensitive resistor. VREF is a voltage provided by a voltage reference source, and refers to a voltage reference source voltage. A current regulating resistor 202 is represented by R, and can be a non-sensitive resistor. The current regulating resistor 202 is configured to set a current Iref of a current source circuit 206. The current source circuit can also refer to a constant current source circuit. The current source circuit 206 includes an amplifier 207 and a switch circuit 208. The specific switch circuit can include an N-channel enhancement type field effect transistor. The current provided by the constant current source is represented by Iref=VREF/R. When VREF and the regulating resistor R are constant, the current Iref is constant. The temperature measurement circuit shown in FIG. 2 includes a one-of-three switch, which for example can be an analog switch. The one-of-three switch includes contactors 2, 3, and 4. The offset voltage Vos of the temperature measurement circuit can be measured by turning ON or OFF the one-of-three switch, and then can be offset to improve an impact of the offset voltage Vos on the temperature measurement. In addition, an output voltage of an amplifier circuit 201 can be measured at different gains to avoid an influence of the unstable power supply voltage, thereby improving calculation accuracy of the thermistor 200. The amplifier circuit 201 in this embodiment can be a differential amplifier circuit which includes a differential amplifier.

The circuit shown in FIG. 2 adopts a time-division sampling mechanism. In this embodiment, sampling refers to collecting an output voltage of the differential amplifier circuit. Specifically, the sampling can be performed in three periods.

During a first period, an analog switch is switched to the contactor 4, i.e., being switched to a position where a non-inverting input terminal and an inverting input terminal of the differential amplifier are shorted. The amplifier circuit 201 includes an Ina instrumentation amplifier (INA). At this time, a voltage of the non-inverting input terminal of the amplifier circuit 201 is equal to a voltage of the inverting input terminal of the amplifier circuit 201, a differential input voltage of the amplifier circuit 201 is 0, and an output of the amplifier circuit 201 is the offset voltage Vos of the amplifier circuit 201. It should be understood that in this embodiment, for the amplifier, the non-inverting input terminal can also be referred to as a positive input terminal, and the inverting input can also be referred to as a negative input terminal.

During a second period, the analog switch is switched to the contactor 2. That is, the analog switch is switched to a position where the non-inverting input terminal and the inverting input terminal of the amplifier are connected to two terminals of the calibration resistor 205. At this time, an input voltage between the non-inverting input terminal and the inverting input terminal of the amplifier is Iref*Rc, and the output voltage amplified by the differential amplifier circuit 201 is Vc=Iref*Rc*Gain+Vos.

During a third period, the analog switch is switched to the contactor 3. That is, the analog switch is switched to a position where the non-inverting input terminal and the inverting input terminal of the amplifier are connected to two terminals of the thermistor 200. At this time, the input voltage between the non-inverting input terminal and the inverting input terminal of the amplifier circuit 201 is Iref*RT, and the output voltage of the amplifier obtained by amplifying the input voltage thereof is VT=Iref*RT*Gain+Vos.

It can be obtained that Iref*Gain=(Vc−Vos)/Rc=(VT−Vos)/RT from Vos, Vc and VT measured during the above three periods. That is, the resistance of the thermistor 200 can be calculated as RT=(VT−Vos)*Rc/(Vc−Vos). The resistance of the thermistor measured by the constant current source driving temperature measurement circuit shown in FIG. 2 is only related to the output of the amplifier and a resistance of the calibration resistor independently of the power supply voltage VCC. Therefore, even if the power supply voltage VCC is unstable, the temperature measurement accuracy will not be greatly reduced due to the instability of the VCC. Compared with the embodiment shown in FIG. 1, the lower measurement accuracy caused by the unstable power supply voltage can be effectively avoided. In addition, since the circuit shown in FIG. 2 has one constant current source circuit, the cost and volume of the circuit are relatively large. It should be noted that the operations during these three periods are not necessarily performed in the order of the first period, the second period and the third period, and they can also be performed in other orders. For example, the analog switch can be firstly switched to the contactor 2, then is switched to the contactor 3, and finally is switched to the contactor 4. In another embodiment, the analog switch can be firstly switched to the contactor 3, then is switched to the contactor 4, and finally is switched to the contactor 2. The sequence of the turn-on states of the analog switches are not limited to the sequence described in this embodiment. In addition, the first period, the second period and the third period can be set to be short. For example, the first period, the second period and the third period can be set in a microsecond short time. In this case, since the temperature generally does not change instantaneously, parameters in the circuit basically do not change, for example, the resistance of the calibration resistor and the offset voltage Vos basically do not change. Therefore, the resistance of the thermistor obtained through the measurement is more accurate.

In view of the disclosure of the above embodiments, the embodiment provides a temperature measurement circuit that uses fewer components, which can effectively reduce the cost and volume of the circuit while improving the accuracy of the temperature measurement. The temperature measurement circuit can include a differential amplifier circuit and a conversion circuit, and a non-inverting input terminal of the differential amplifier circuit is unloaded, or is connected to the thermistor or the calibration resistor. The thermistor is configured to convert the temperature signal of a measured object to a resistance signal. The thermistor in this embodiment can also be referred to as a thermal resistor. The thermal resistor is a type of sensitive element and belongs to a semiconductor device. According to the temperature coefficient, the thermal resistor can be classified into a positive temperature coefficient thermal resistor and a negative temperature coefficient thermal resistor. The thermal resistor is typically characterized in that it is sensitive to temperature and exhibits different resistances at different temperatures. For example, the positive temperature coefficient thermal resistor has a greater resistance at a higher temperature, and the negative temperature coefficient thermal resistor has a smaller resistance at a lower temperature. In this embodiment, the measured object can be gas, liquid or solid, and can be a biological body or a non-biological body. When the non-inverting input terminal of the differential amplifier circuit is unloaded, the differential amplifier circuit outputs the offset voltage. It should be understood that the offset voltage in this embodiment can also be referred to as an input offset voltage which is a difference between the direct current voltages to be applied to the two input terminals to obtain a constant zero voltage output at the output terminal in the differential amplifier or a differential input operational amplifier. When the non-inverting input terminal of the differential amplifier circuit is connected to the calibration resistor, the differential amplifier circuit outputs a calibration voltage. When the non-inverting input terminal of the differential amplifier circuit is connected to the thermistor, the differential amplifier circuit outputs a temperature measurement voltage of the measured object. It should be understood that only when the non-inverting input terminal of the differential amplifier circuit is connected to the thermistor, a signal output by the differential amplifier circuit contains temperature information of the measured object. However, since the temperature measurement voltage can be inaccurate, the measurement can be inaccurate if the temperature of the measured object is obtained only based on this temperature measurement voltage. In this embodiment, the differential amplifier circuit is connected to a conversion circuit, and the conversion circuit is configured to obtain a temperature signal of the measured object based on the offset voltage, the calibration voltage, and the temperature measurement voltage. In this way, the obtained temperature signal is thus more accurate.

Figure 3A:
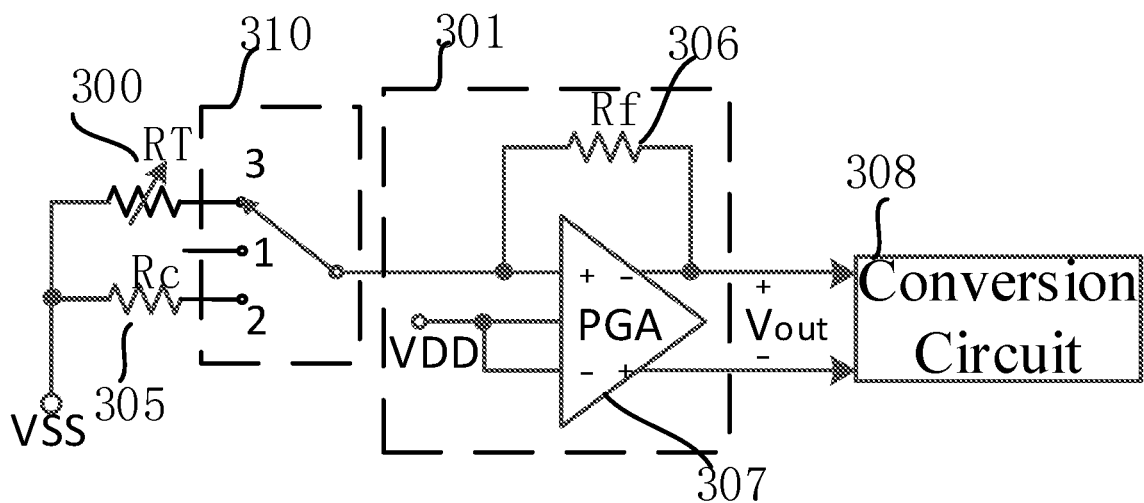
FIG. 3A is a schematic diagram of a further another temperature measurement circuit according to an embodiment of the present disclosure.

Specifically, a temperature measurement circuit shown in FIG. 3A is taken as an example for the description. The temperature measurement circuit shown in FIG. 3A includes a switch circuit 310, a differential amplifier (DA) circuit 301, and a conversion circuit 308. The switch circuit. 310 is connected to the differential amplifier circuit 301, and the differential amplifier circuit 301 is connected to the conversion circuit 308. In this embodiment, the differential amplifier circuit 301 including differential a programmable gain amplifier (PGA) is taken as an example. The thermistor 300 is represented by RT, the calibration resistor 305 is represented by Rc, and the feedback resistor 306 is represented by Rf. Each of the feedback resistor 306 and the calibration resistor 305 is a non-sensitive resistor. The differential amplifier circuit 301 includes a differential amplifier 307. The switch circuit 310 includes at least one switch unit, and different gains Gain of the temperature measurement circuit can be provided by the switch circuit 310 to obtain a resistance of the thermistor 300. When a contact of the switch unit is connected to the contactor 3, the non-inverting input terminal of the differential amplifier 307 is connected to a first terminal of the thermistor 300. When the contact of the switch unit is connected to the contactor 2, the inverting input terminal of the differential amplifier 307 is connected to a first terminal of the calibration resistor 305. When the contact of the switch unit is connected to the contactor 1, the non-inverting input terminal of the differential amplifier 307 is unloaded. Specifically, the non-inverting input terminal of the differential amplifier is unloaded by the switch unit during the first period. At this time, the differential amplifier circuit outputs the offset voltage. In this embodiment, for convenience of expression, the offset voltage can also be referred to as a first output voltage. The non-inverting input terminal of the differential amplifier is connected to the first terminal of the calibration resistor by the switch unit during the second period. At this time, the differential amplifier circuit outputs the calibration voltage. In this embodiment, for convenience of expression, the calibration voltage can also be referred to as a second output voltage. The non-inverting input terminal of the differential amplifier is connected to the first terminal of the thermistor by the switch unit during the third period. At this time, the differential amplifier circuit outputs the temperature measurement voltage. In this embodiment, for convenience of expression, the temperature measurement voltage can also be referred to as a third output voltage, and the conversion circuit is configured to output a temperature signal based on the first output voltage, the second output voltage, and the third output voltage. In this embodiment, since the differential amplifier circuit includes the differential amplifier, it should be understood that the non-inverting input terminal of the differential amplifier circuit can be understood as the non-inverting input terminal of the differential amplifier, the expression "the non-inverting input terminal of the differential amplifier circuit is unloaded" can be understood as the non-inverting input terminal of the differential amplifier being unloaded, and the expression "the non-inverting input terminal of the differential amplifier is connected to the calibration resistor" can be understood as the non-inverting input terminal of the differential amplifier being connected to the calibration resistor, and the expression "the non-inverting input terminal of the differential amplifier circuit is connected to the thermistor" can be understood as the non-inverting input terminal of the differential amplifier is connected to the thermistor.

Figure 4:
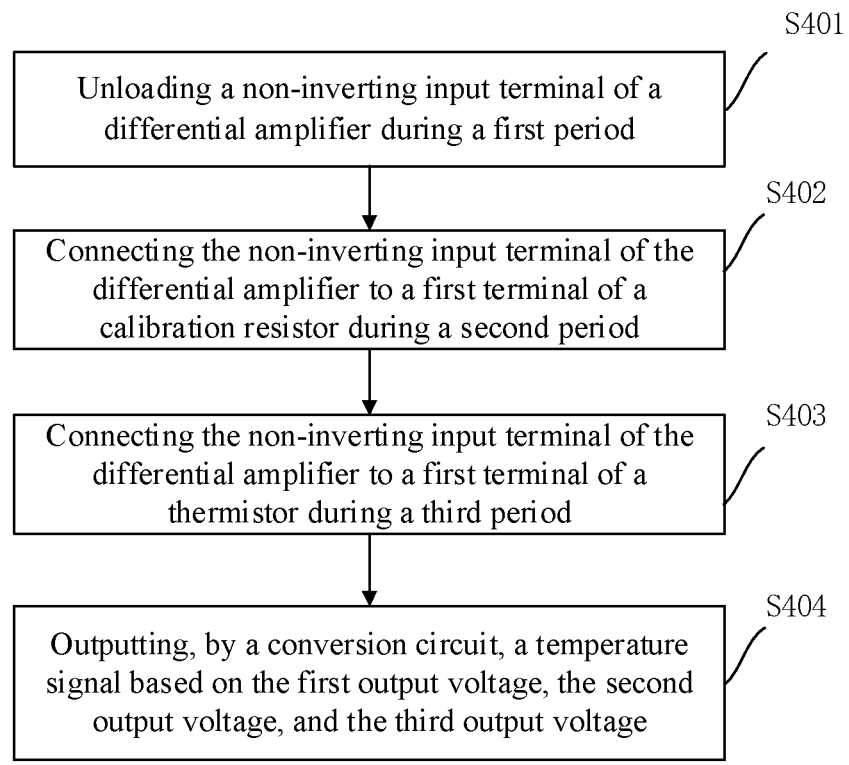
FIG. 4 is a flowchart of a temperature measurement method corresponding to the temperature measurement circuit according to an embodiment of the present disclosure.

Specifically, referring to FIG. 4, a temperature measurement method for measuring temperature with the temperature measurement circuit includes the following steps.

At S401, during the first period, the non-inverting input terminal of the differential amplifier is unloaded.

At S401, when the non-inverting input terminal of the differential amplifier 307 is unloaded, the output voltage of the differential amplifier circuit 301 is the first output voltage. At this time, the first output voltage can also be referred to as the offset voltage Vos. It should be understood that a voltage of the non-inverting input terminal of the differential amplifier is equal to a voltage of the inverting input terminal of the differential amplifier when the non-inverting input terminal of the differential amplifier is unloaded during the first period. Therefore, the differential input voltage of the differential amplifier is 0V during the first period. Ideally, the output voltage of the differential amplifier circuit is also 0V. However, in an actual circuit, the output voltage of the differential amplifier circuit cannot be 0V during the first period due to the offset voltage. Therefore, the offset voltage Vos of the circuit can be obtained by measurement, so that the accuracy of temperature measurement can be improved subsequently based on the offset voltage.

At S402, during the second period, the non-inverting input terminal of the differential amplifier is connected to the first terminal of the calibration resistor.

At S402, when the non-inverting input terminal of the differential amplifier 307 is connected to the first terminal of the calibration resistor 305, the output voltage of the differential amplifier circuit 301 is the second output voltage. For convenience of expression, the second output voltage can be denoted as Vc, the second terminal of the resistor 305 is connected to a second voltage VSS, and the inverting input terminal of the differential amplifier 307 is connected to a first voltage VDD. Thus, the differential input voltage of the differential amplifier 307 can be calculated as (VSS−VDD). During the second period, the gain Gain of the differential amplifier circuit 301 is 2Rf/Rc. Hence, the second output voltage is Vc=(VSS−VDD)*2Rf/Rc+Vos, where Rf denotes a resistance of a feedback resistor located between the non-inverting input terminal and the inverting output terminal of the amplifier. It should be noted that, the feedback resistor Rf and a feedback capacitor Cf can be disposed in parallel at two terminals of the differential amplifier, and the following descriptions are made by taking the feedback resistor Rf disposed between the non-inverting input terminal and the inverting output terminal as an example.

At S403, during the third period, the non-inverting input terminal of the differential amplifier is connected to the first terminal of the thermistor.

At S403, when the non-inverting input terminal of the differential amplifier 307 is connected to the first terminal of the thermistor RT, the output voltage of the differential amplifier circuit 301 is the third output voltage. For convenience of expression, the third output voltage is denoted as VT. The second terminal of the calibration resistor is connected to the second voltage VSS, and the inverting input terminal of the differential amplifier 307 is connected to the first voltage VDD. Thus, during the third period, the differential input voltage of the differential amplifier 307 is (VSS−VDD), and the gain Gain of the differential amplifier circuit 301 is 2Rf/RT. Therefore, the third output voltage is VT=(VSS−VDD)*2Rf/RT+Vos.

In FIG. 4, the method is merely described in the order of steps S401, S402 and S403 as an example. However, the order of performing the steps S401, S402 and S403 is not limited thereto. That is, the order of the first period, the second period and the third time is not limited. Specifically, the non-inverting input terminal of the differential amplifier 307 can also be connected to the first terminal of the thermistor 300 to obtain the third output voltage VT, and then the non-inverting input terminal of the differential amplifier 307 can be connected to the first terminal of the calibration resistor 305 to obtain the second output voltage Vc, and the non-inverting input terminal of the differential amplifier is unloaded to obtain the first output voltage Vos. That is, the method is performed in an order of S403-S402-S401. In an embodiment, the non-inverting input terminal of the differential amplifier 307 can be connected to the first terminal of the calibration resistor 305 to obtain the second output voltage Vc, then the non-inverting input terminal of the differential amplifier 307 is unloaded to obtain the first output voltage Vos, and the non-inverting input terminal of the differential amplifier 307 is finally connected to the first terminal of the thermistor 300 to obtain the third output voltage VT. That is, the method is performed in an order of S403-S401-S402. In another embodiment, the non-inverting input terminal of the differential amplifier 307 can be connected to the first terminal of the calibration resistor 305 to obtain the second output voltage Vc, then the non-inverting input terminal of the differential amplifier 307 is unloaded to obtain the first output voltage Vos, and the non-inverting input terminal of the differential amplifier 307 is finally connected to the first terminal of the thermistor 300 to obtain the third output voltage VT. That is, the method is performed in an order of S402-S401-S403. In an embodiment, the non-inverting input terminal of the differential amplifier 307 can be connected to the first terminal of the calibration resistor 305 to obtain the second output voltage Vc, and then the non-inverting input terminal of the differential amplifier 307 is connected to the first terminal of the thermistor 300 to obtain the third output voltage VT, and the non-inverting input terminal of the differential amplifier 307 is finally unloaded to obtain the first output voltage Vos. That is, the method is performed in an order of S402-S403-S401. In an embodiment, the non-inverting input terminal of the differential amplifier 307 can be firstly unloaded to obtain the first output voltage Vos, and then the non-inverting input terminal of the differential amplifier 307 is connected to the first terminal of the thermistor 300 to obtain the third output voltage VT, and the non-inverting input terminal of the differential amplifier 307 is finally connected to the first terminal of the calibration resistor 305 to obtain the second output voltage Vc. That is, the method is performed in an order of S401-S403-S402.

After the first output voltage Vos, the second output voltage Vc, and the third output voltage VT are obtained through measurement, S404 can be performed.

At S404, the conversion circuit outputs the temperature signal based on the first output voltage, the second output voltage, and the third output voltage.

Figure 5A:
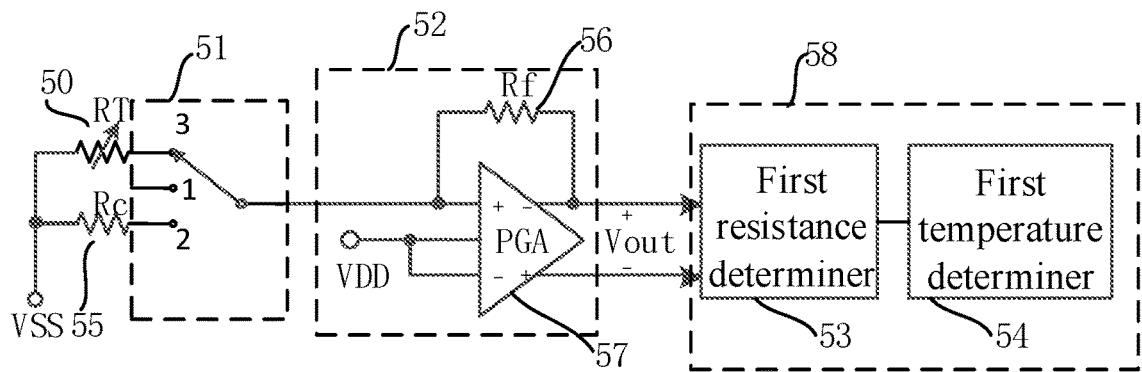
FIG. 5A is a schematic diagram of a yet another temperature measurement circuit according to an embodiment of the present disclosure.

In view of the disclosure of the above embodiments, in an embodiment, referring to FIG. 5A, the conversion circuit 58 can include a first resistance determiner 53 and a first temperature determiner 54. The first resistance determiner 53 is connected to the first temperature determiner 54. The first resistance determiner is configured to output the resistance signal of the thermistor based on the first output voltage, the second output voltage, and the third output voltage, and the first temperature determiner is configured to convert the resistance signal to the temperature signal. In this embodiment, the switch circuit 51, the differential amplifier circuit 52, the differential amplifier 57, the feedback resistor 56, the conversion circuit 58, the thermistor 50, and the calibration resistor 55 are the same as or similar to those in the above embodiments, and the description thereof will not be repeated herein.

Figure 5B:
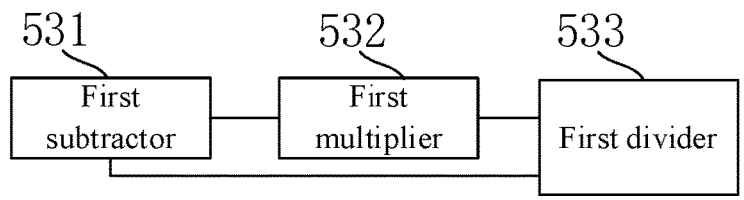
FIG. 5B is a schematic diagram of a first resistance determiner according to an embodiment of the application.

In view of the disclosure of the above embodiments, in an embodiment, referring to FIG. 5B, the first resistance determiner 53 can include a first subtractor 531, a first multiplier 532, and a first divider 533. The first subtractor is configured to calculate a first difference and a second difference. The first difference is a difference between the second output voltage Vc and the first output voltage Vos, and the second difference is a difference between the third output voltage VT and the first output voltage Vos. The first multiplier is configured to calculate a first product which is a product of the first difference (Vc−Vos) and the resistance of the calibration resistor Rc. The first divider is configured to calculate a resistance signal that is the first product (Vc−Vos)*Rc divided by the second difference (VT−Vos). FIG. 5B only shows a structure of the first resistance determiner 53. As shown in FIG. 5B, the first subtractor is connected to the differential amplifier circuit 52, and the first divider is connected to the first temperature determiner. Specifically, the first temperature determiner can include an MCU. For example, the MCU can convert the resistance signal to the temperature signal based on a corresponding relationship between the resistance of the thermistor RT and the temperature. In addition, the temperature measurement circuit can further include one or more registers to store the calculated parameters.

Figure 5C:
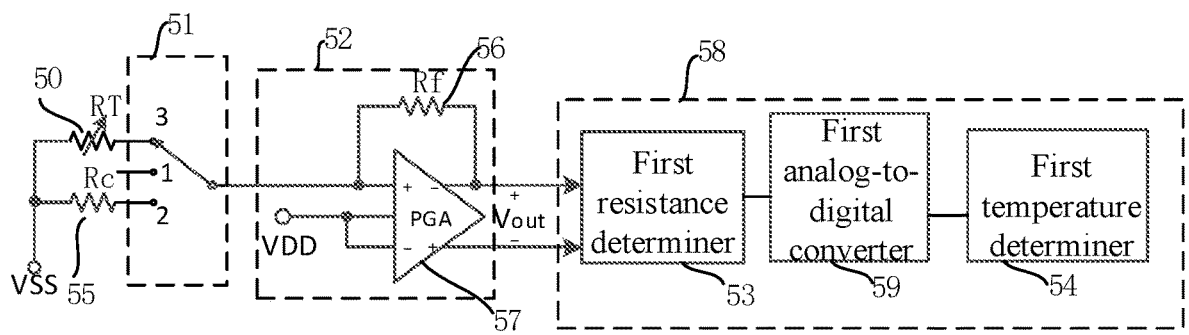
FIG. 5C is a schematic diagram of a further another temperature measurement circuit according to an embodiment of the present disclosure.
Figure 5D:
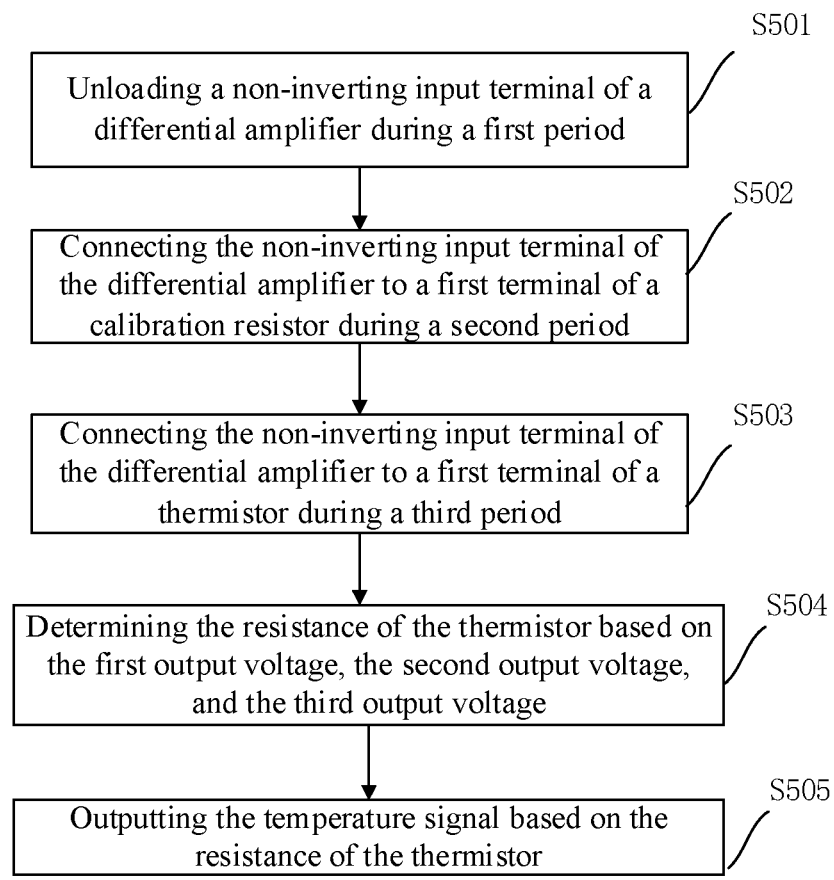
FIG. 5D is a flowchart of another temperature measurement method corresponding to the temperature measurement circuit according to an embodiment of the present disclosure.

In view of the disclosure of the above embodiments, in an embodiment, referring to FIG. 5C, the conversion circuit further includes a first analog-to-digital converter 59 that is connected to the first resistance determiner 53. The first analog-to-digital converter is configured to convert the resistance signal to a digital resistance signal. The digital resistance signal can be understood as a digital signal representation of the resistance of the thermistor. The first analog-to-digital converter is also connected to the first temperature determiner 54. The first temperature determiner 54 is configured to convert the digital resistance signal to the temperature signal. Specifically, the first analog-to-digital converter can be connected to the first divider and configured to convert the resistance signal obtained from the divider to the digital resistance signal. The digital resistance can be understood as a digital representation of the resistance of the thermistor. In view of the disclosure of the above embodiments, in an embodiment, referring to FIG. 5D, outputting, by the conversion circuit, the temperature signal based on the first output voltage, the second output voltage, and the third output voltage may include the following steps:

S504: determining the resistance of the thermistor based on the first output voltage, the second output voltage, and the third output voltage; and S505: outputting the temperature signal based on the resistance of the thermistor.

S501 to S503 are the same as or similar to S401 to S403 in the above embodiments, respectively, and the description thereof will not repeated herein. In the above S401-S403, the first output voltage Vos has been obtained, the magnitude relationships between the second output voltage Vc and the first voltage, the second voltage, the resistance of the feedback resistor, the resistance of the calibration resistor, and the first output voltage Vos are known, and the magnitude relationships between the third output voltage VT and the first voltage, the second voltage, the resistance of the feedback resistor, the resistance of the thermistor and the first output voltage Vos are already known. Therefore, the resistance of the thermistor can be determined. Specifically, the resistance of the thermistor RT can be determined based on the first output voltage Vos, the second output voltage Vc, the third output voltage VT, and the resistance of the calibration resistor Rc. After determining the resistance of the thermistor RT, the temperature can be determined based on the resistance of the thermistor, and then the temperature signal is output. Specifically, the temperature measurement circuit can further include an output circuit that is connected to an output circuit. The output circuit is configured to display the temperature. For example, the output circuit can include a display, and the output temperature signal can be displayed on the display or be output in a form of voice. It should be understood that the resistance of the thermistor RT is changed as the temperature changes, and the resistance of the thermistor RT has a corresponding relationship with the temperature. Therefore, after the resistance of the thermistor RT is determined, the temperature is also determined. In addition, a user can select an appropriate thermistor based on the temperature measurement range and select the temperature drift and the precision of the thermistor.

In view of the disclosure of the above embodiments, in this embodiment, the temperature measurement circuit can include a thermistor and a calibration resistor. That is, the thermistor and the calibration resistor can be integrated on the same chip with the switch circuit, the differential amplifier circuit, and the conversion circuit. In addition, the temperature measurement circuit can also not include the thermistor and calibration resistor. That is, the thermistor and calibration resistor, which serves as peripherals, can be connected to the temperature measurement circuit, so that the user can choose the thermistor and calibration resistor as desired, so that the suitable thermistor and calibration resistor are connected to the temperature measurement circuit to meet different needs.

In view of the disclosure of the above embodiments, in an embodiment, determining the resistance of the thermistor RT based on the first output voltage Vos, the second output voltage Vc, and the third output voltage VT incudes obtaining the resistance of the thermistor RT by dividing the product of the first difference and the calibration resistance Rc by the second difference, where the first difference is the difference between the second output voltage Vc and the first output voltage Vos, and the second difference is the difference between the third output voltage VT and the first output voltage Vos. Specifically, since Vc=(VSS−VDD)*2Rf/Rc+Vos, VT=(VSS−VDD)*2Rf/RT+Vos, then (VSS−VDD)*2Rf=(Vc−Vos)*Rc=(VT−Vos)*RT. Thus, RT=(Vc−Vos)*Rc/(VT−Vos), the resistance of the thermistor RT is related to the first output voltage Vos, the second output voltage Vc, the third output voltage VT, and the resistance of the calibration resistor Rc.

In view of the disclosure of the above embodiments, in an embodiment, referring to FIG. 3A, the inverting input terminal of the differential amplifier 307 is connected to the first voltage VDD, the second terminal of the thermistor RT is connected to the second voltage VSS, the second terminal of the calibration resistor Rc is connected to the second voltage VSS, the second voltage VSS is not equal to the first voltage VDD, and the first voltage VDD can be greater than the ground voltage and smaller than the power supply voltage. The second voltage VSS can be greater than or equal to the ground voltage and smaller than the power supply voltage. In an embodiment, if the first voltage VDD is equal to the second voltage VSS, the differential input voltage of the differential amplifier 307 is 0, and the output voltage of the differential amplifier 307 are all offset voltage during the first period, the second period, and the third period. Therefore, in order to accurately measure the temperature, the first voltage VDD is not equal to the second voltage VSS, i.e., the first voltage is greater than or smaller than the second voltage.

In view of the disclosure of the above embodiments, in an embodiment, referring to FIG. 3A, the differential amplifier circuit 301 further includes the feedback resistor 306. That is, the amplifier circuit 301 includes the amplifier 307 and the feedback resistor 306. The two terminals of the feedback resistor 306 are connected to the non-inverting input terminal and the inverting output terminal of the differential amplifier 307, respectively. In an embodiment, the inverting output terminal can also be referred to as a negative output terminal, and the non-inverting output terminal can also be referred to as a positive output terminal. In order to avoid saturation of the amplifier as much as possible, the output voltage of the differential amplifier circuit 301 is smaller than the power supply voltage VCC during each of the first period, the second period, and the third period. For the second period, Vc=[(VSS−VDD)*2Rf/Rc+Vos]<VCC, where since VSS−VDD can be positive or negative, the second output voltage Vc can correspondingly also be positive or negative. Since the first output voltage Vos is generally lower, if the first output voltage Vos is ignored, then Rc>2Rf*|(VSS−VDD)/VCC|, i.e., the resistance of the calibration resistor Rc is greater than twice the resistance of the feedback resistor multiplied by a first preset absolute value, where the first preset absolute value |(VSS−VDD)/VCC| is an absolute value of a quotient of the difference between the first voltage VSS and the second voltage VDD divided by the power supply voltage VCC. In addition, taking the influence of Vos into account, Rc>2Rf*|(VSS−VDD)/(VCC−Vos)|, i.e., the resistance of the calibration resistor Rc is greater than twice the resistance of the feedback resistor multiplied by a second preset absolute value, where the second preset absolute value|(VSS−VDD)/(VCC−Vos)| is an absolute value of a quotient of the difference between the first voltage VSS and the second voltage VDD divided by the difference between the power supply voltage VCC and the first output voltage Vos.

In view of the disclosure of the above embodiment, in an embodiment, during the first period, when the non-inverting input terminal of the differential amplifier 307 is unloaded, the gain of the differential amplifier circuit is 0. During the second period, when the non-inverting input terminal of the differential amplifier 307 is connected to the first terminal of the calibration resistor, the gain of the differential amplifier circuit is equal to twice the resistance of the feedback resistor divided by the resistance of the calibration resistor, i.e., Gain=2*Rf/Rc. During the third period, when the non-inverting input terminal of the differential amplifier 307 is connected to the first terminal of the thermistor, the gain of the differential amplifier circuit is equal to twice the resistance of the feedback resistor divided by the resistance of the thermistor, i.e., Gain=2*Rf/RT.

Figure 3B:
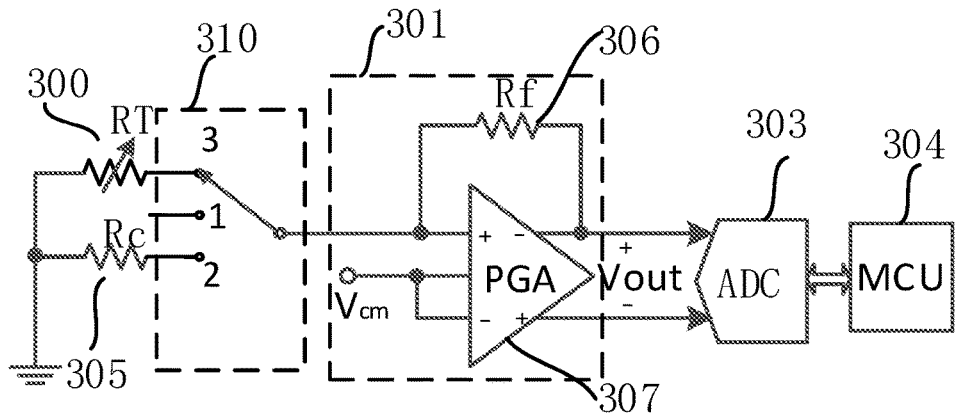
FIG. 3B is a schematic diagram of a still another temperature measurement circuit according to an embodiment of the present disclosure.

In view of the disclosure of the above embodiments, in an embodiment, referring to FIG. 3B, the first voltage VDD can be a common mode voltage Vcm, where Vcm=VCC/2. Since a voltage source of the common mode voltage is generally provided in the circuit, when the first voltage is the common mode voltage, there is no need to additionally provide a VDD generation circuit, which can reduce the cost and the circuit volume. In order to avoid the saturation of the amplifier as much as possible so that the amplifier can be ensured to operate normally, 2*Rf/RT<VCC/Vcm=2 can be satisfied. In addition, 2*Rf/Rc<VCC/Vcm=2, That is, the resistance of the calibration resistor Rc is greater than the resistance of the feedback resistor Rf, or the resistance of the feedback resistor Rf is smaller than the resistance of the calibration resistor Rc. For example, the resistance of the feedback resistance Rf is 10 kΩ, and the resistance of the calibration resistor Rc is 30 kΩ. The resistance of the feedback resistor Rf is at least smaller than the resistance of the calibration resistor Rc, which can improve the stability of the circuit and the accuracy of the measurements. In addition, since a ground voltage is generally also provided in the circuit, the second voltage can be the ground voltage. In this way, there is no need to additionally provide the second voltage generating circuit, which can reduce the cost and the circuit volume.

Figure 6:
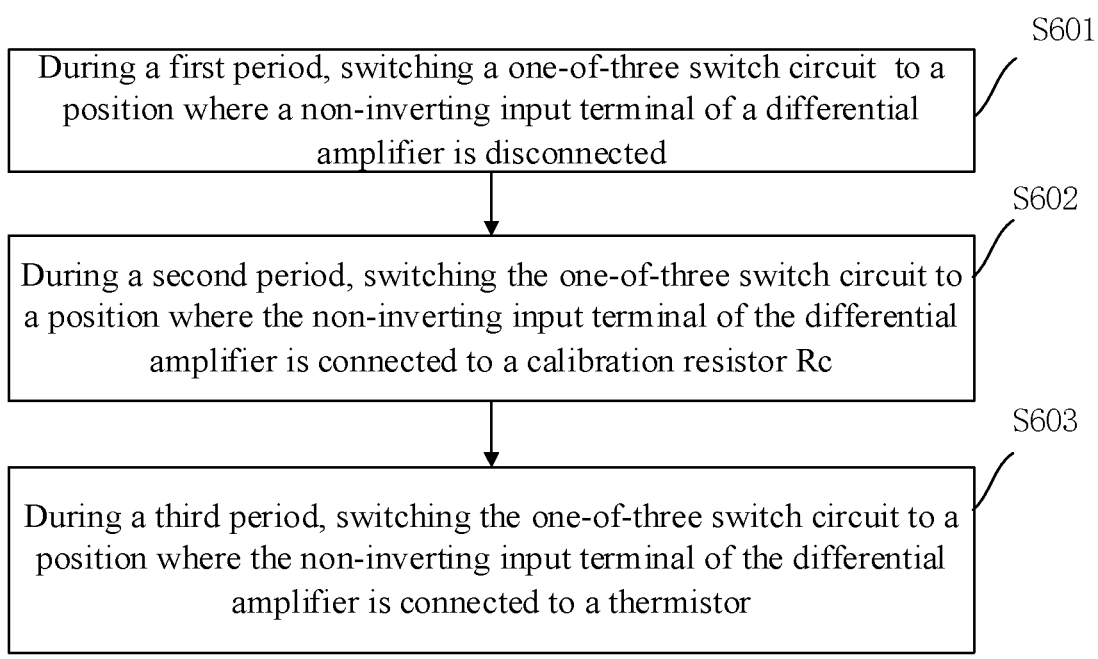
FIG. 6 is a flowchart of a further another temperature measurement method corresponding to the temperature measurement circuit according to an embodiment of the present disclosure.

In view of the disclosure of the above embodiments, in an embodiment, the switching circuit can be a one-of-three switching circuit. That is, the switching unit is the one-of-three switching circuit to switch the connection state of the non-inverting input terminal of the differential amplifier among the first period, the second period, and the third period. Specifically, refer to FIG. 3A, the one-of-three switching circuit can include contactors 1, 2 and 3. By the connection state between the contact of the one-of-three switching circuit and the contactors, the offset voltage Vos and the output of the circuit at different gains can be measured respectively, so as to avoid the influence of the unstable power supply voltage on the accuracy of the measurements, which improves the calculation accuracy of the thermistor. The one-of-three switching circuit can be an analog switch. The temperature measurement circuit adopts a time-division sampling mechanism. Specifically, a description will be set forth by taking the first voltage being the common mode voltage Vcm and the second voltage being GND as an example. Referring to FIG. 6, a temperature measurement method for measuring temperature by the temperature measurement circuit includes S601, S602, and S603.

At S601, during the first period, the one-of-three switch circuit is switched to a position where the non-inverting input terminal of the differential amplifier is disconnected. That is, the contact of the one-of-three switch is in contact with the contactor 1. At this time, the non-inverting input terminal of the differential amplifier 301 is unloaded, and the output Vout of the differential amplifier circuit is the offset voltage Vos of the amplifying circuit.

At S602, during the second period, the one-of-three switch circuit is switched to a position where the non-inverting input terminal of the differential amplifier is connected to the calibration resistor Rc. Specifically, the non-inverting input terminal of the differential amplifier is connected to the first terminal of the calibration resistor Rc. That is, the contact of the one-of-three switch is in contact with the contactor 2, the non-inverting input terminal of the differential amplifier is connected to the first terminal of the calibration resistor Rc, and the gain of the differential amplifier circuit 301 is determined by the feedback resistor 306 and the calibration resistor 305. Specifically, the gain of the differential amplifier circuit is 2*Rf/Rc. Thus, the output voltage of the differential amplifier circuit is Vc=Vcm*2Rf/Rc+Vos.

At S603, during the third period, the one-of-three switch circuit is switched to a position where the non-inverting input terminal of the differential amplifier is connected to the thermistor. Specifically, the non-inverting input terminal of the differential amplifier is connected to the first terminal of the thermistor RT. That is, the contact of the one-of-three switch is in contact with the contactor 3, and the gain of the differential amplifier circuit 301 is determined by the feedback resistor 306 and the thermistor 300, Specifically, the gain of the differential amplifier circuit is 2*Rf/RT, and the output voltage obtained by the differential amplifier circuit VT is Vcm*2Rf/RT+Vos.

Therefore, from the above two formulas, it can be obtained that Vcm*2Rf=(Vc−Vos)*Rc=(VT−Vos)*RT. That is, the resistance of the thermistor RT can be calculated as RT=(Vc−Vos)*Rc/(VT−Vos). The resistance of the thermistor RT obtained by the temperature measurement circuit shown in FIG. 3A and FIG. 3B is only related to the output voltage of the differential amplifier circuit and the resistance of the calibration resistor. Compared with the embodiment shown in FIG. 1, low temperature measurement accuracy caused by the unstable power supply voltage can be effectively eliminated. In addition, compared with the embodiment shown in FIG. 2, no current source is required to provide a constant current. Therefore, the cost and volume of the circuit can be reduced.

Figure 3C:
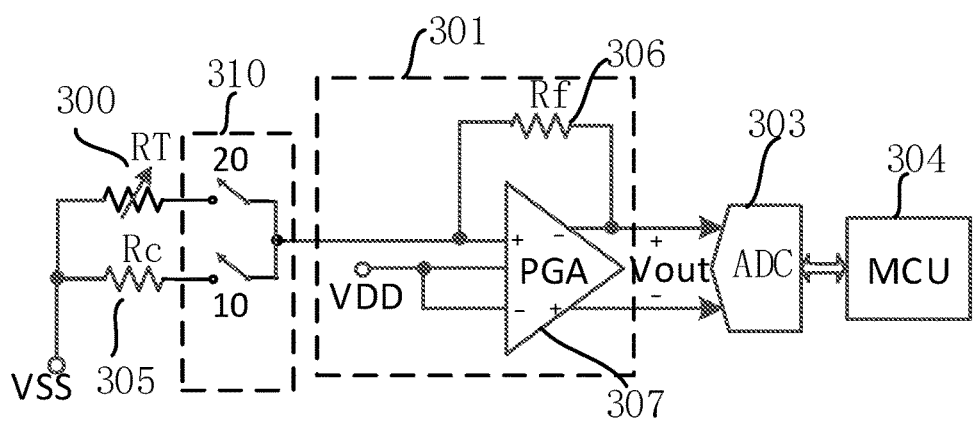
FIG. 3C is a schematic diagram of a yet another temperature measurement circuit according to an embodiment of the present disclosure.

In view of the disclosure of the above embodiments, in an embodiment, the switch circuit 310 can include a first switch unit and a second switch unit. Referring to FIG. 3C, during the first period, the first switch unit 10 and the second switch unit 20 both are in an OFF state. In this case, the non-inverting input terminal of the differential amplifier is unloaded, so that the differential amplifier circuit outputs the first output voltage Vos during the first period.

During the second period, the first switch unit 10 is in an ON state. In this case, the non-inverting input terminal of the differential amplifier is connected to the first terminal of the calibration resistor, so that the differential amplifier circuit outputs the second output voltage Vc during the second period. When the first switch unit 10 is in the ON state, the second switch unit 20 is in the OFF state.

During the third period, the second switch unit 20 is in the ON state. In this case, the non-inverting input terminal of the differential amplifier is connected to the first terminal of the thermistor, so that the differential amplifier circuit outputs the third output voltage VT during the third period. When the switch unit 20 is in the ON state, the first switch unit 10 is in the OFF state.

In view of the disclosure of the above embodiments, in an embodiment, referring to FIG. 3B or FIG. 3C, the conversion circuit includes a second analog-to-digital converter 303 and a control circuit 304.

The analog-to-digital converter is configured to perform analog-to-digital conversion on the first output voltage, the second output voltage, and the third output voltage of the differential amplifier circuit to obtain a first digital signal, a second digital signal, and a third digital signal, respectively. In this embodiment, the first digital signal, the second digital signal, and the third digital signal can also be referred to as a digital offset voltage, a digital calibration voltage, and a digital temperature measurement voltage, respectively. It should be understood that the first digital signal is a digital signal representation of the first output voltage, the second digital signal is a digital signal representation of the second output voltage, and the third digital signal is a digital signal representation of the third output voltage.

The control circuit 304 is configured to convert the first digital signal, the second digital signal, and the third digital signal output by the analog-to-digital converter to temperature signals. That is, the control circuit is configured to convert the digital offset voltage, the digital calibration voltage, and the digital temperature measurement voltage output by the analog-to-digital converter to the temperature signal.

Specifically, in an embodiment, the analog-to-digital converter performs analog-to-digital conversion on the first output voltage, the second output voltage, and the third output voltage of the differential amplifier circuit, and the analog-to-digital converted first output voltage, the analog-to-digital converted second output voltage, and the analog-to-digital converted third output voltage are the digital signals. The control circuit processes these digital signals to obtain the temperature signals, and the processing method refer to the method of obtaining the resistance of the thermistor described in the above embodiments. The temperature signal is then obtained based on the corresponding relationship between the resistance of the thermistor and the temperature.

Figure 3D:
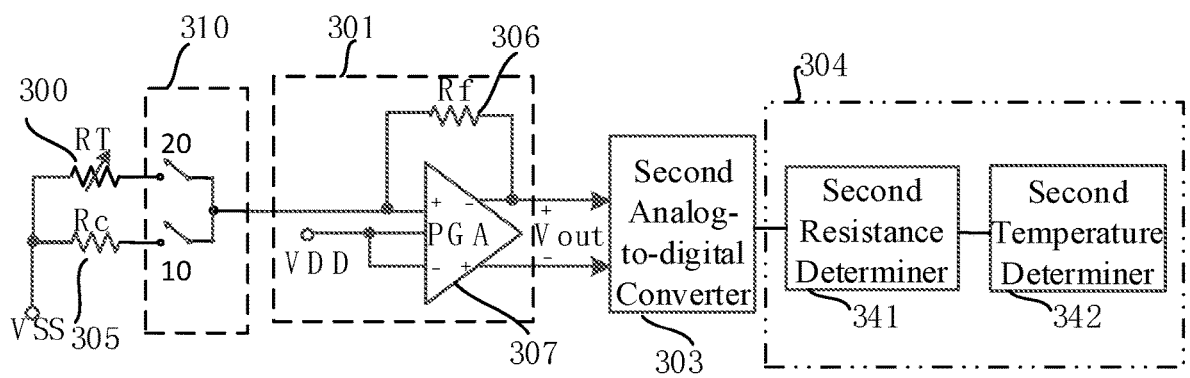
FIG. 3D is a schematic diagram of a further another temperature measurement circuit according to an embodiment of the present disclosure.

In view of the disclosure of the above embodiments, in an embodiment, referring to FIG. 3D, the control circuit 304 includes a second resistance determiner 341 and a second temperature determiner 342 connected to the second resistance determiner 341. The second resistance determiner is configured to convert the first digital signal, the second digital signal, and the third digital signal to digital resistance signals. That is, the second resistance determiner is configured to convert the digital offset voltage, the digital calibration voltage, and the digital temperature measurement to digital resistance signals of the thermistor. The second resistance determiner is connected to the second analog-to-digital conversion circuit and configured to convert the digital resistance signal to the temperature signal.

Figure 3E:
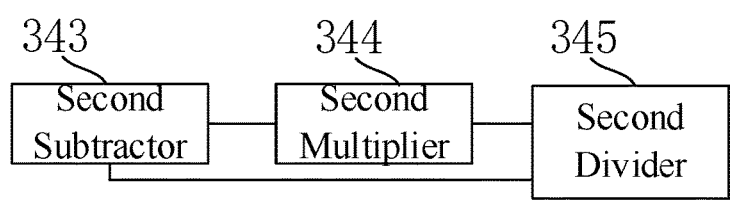
FIG. 3E is a schematic diagram of a second resistance determiner according to an embodiment of the present disclosure.

In view of the disclosure of the above embodiments, in an embodiment, referring to FIG. 3E, the second resistance determiner includes a second subtractor 343, a second multiplier 344, and a second divider 345.

The second subtractor is configured to calculate a third difference and a fourth difference. The third difference is a difference (Vc−Vos) between the second digital signal and the first digital signal, and the fourth difference is a difference (VT−Vos) between the third digital signal and the first digital signal. That is, the third difference is a difference between the digital calibration voltage and the digital offset voltage, and the fourth difference is a difference between the digital temperature measurement voltage and the digital offset voltage.

The second multiplier is configured to calculate a second product which is a product (Vc−Vos)*Rc of the third difference and the resistance of the calibration resistor.

The second divider is configured to calculate the digital resistance signal that is the second product divided by the fourth difference, i.e., a quotient (Vc−Vos)*Rc/(VT−Vos).

In view of the disclosure of the above embodiments, in an embodiment, the first period, the second period and the third period are continuous in time. That is, these three periods are one next to another. For example, the first period is next to the second period with a time interval of 0 therebetween; the third period can be next to the first period or to the second period, and a time interval between the third period and the first period is 0, or a time interval between the third period and the second period is 0, so as to perform the measurement in a continuous period to avoid too long measurement time due to the time intervals among the measurement periods of the first output voltage, the second output voltage and the third output voltage. In a case of too long measurement time, the actual temperature can be changed, which achieves inaccurate measurement, or the offset voltage change would also result in reduced measurement accuracy. It should be understood that the shorter the measurement period, the higher the accuracy of measurement and the real-time performance of the measurement will be better because the parameters of the circuit will not be changed in a shorter period. In addition, each of the first period, the second period, and the third period is shorter than or equal to 10 microseconds, and the measurement is thus completed within about 30 microseconds. In a short period of microsecond, the temperature is generally not changed instantaneously. Therefore, even there is a temperature drift phenomenon, the parameters of the circuit will generally remain unchanged. For example, the resistance of the calibration resistor Rc and the offset voltage Vos are generally not changed.

In view of the disclosure of the above embodiments, in an embodiment, a sum of the first period, the second period, and the third period is shorter than or equal to a first preset duration. In addition, the third period is longer than or equal to a second preset duration. In an embodiment, the first preset duration can be 50 us, 30 us, or 20 us. The shorter the first preset duration, the temperature measurement can be completed in a shorter period. In addition, since the parameters of the circuit will not be changed in a short period, and the temperature is generally not changed instantaneously, the accuracy of temperature measurement is improved. In addition, the third period is longer than or equal to the second preset duration. The second preset duration can be 0.5 us, 1 us, 5 us, or 10 us. It should be understood that the third period cannot be too short. If the third period is too short, since a response of the thermistor to the temperature takes a certain period, the measurement result has been output before the resistance of the thermistor has not changed sufficiently due to the change of the ambient temperature, which can result in inaccurate measurement.

In view of the disclosure of the above embodiments, in an embodiment, the first period is prior to the second period, and the second period is prior to the third period. That is, the first output voltage Vos is firstly measured, then the second output voltage is measured, and the third output voltage is finally measured. Alternatively, the second period is prior to the third period, and the third period is prior to the first period. In an embodiment, the measurement of the second output voltage Vc is next to the measurement of the third output voltage VT so that the measurement errors caused by the changes in the first voltage VDD, the second voltage VSS and the resistance of the feedback resistor Rf when measuring the second output voltage Vc and the third output voltage VT, is avoided. If the first period, the second period, and the third period are continuous in time and the second period is next to the third period, the accuracy of the second output voltage and the accuracy of the third output voltage can be further improved. Therefore, the temperature obtained by the measurement is also more accurate. In addition, the first period is prior to the second period, and the second period is prior to the third period. In this way, the second period can be next to the third period, and the third output voltage VT can be the last one to be output, and the real-time performance of the temperature measurement is better.

In view of the disclosure of the above embodiments, in an embodiment, the differential amplifier circuit can be a differential programmable gain amplifier circuit. In this embodiment, the resistance of the feedback resistor Rf is variable. That is, the resistance of the feedback resistor Rf can be programmed. Therefore, the gain of the differential amplifier circuit is variable. In this embodiment, the resistance of the feedback resistor Rf can be programmed after one or more temperature measurements. Specifically, when measuring the first output voltage Vos, the resistance of the feedback resistor Rf can be programmed. Also, as described in the above embodiments, since the resistance of the calibration resistor is related to the resistance of the feedback resistor, the feedback resistor can be set to be adjustable in order to provide more selections for the user when selecting the calibration resistor to facilitate integration. That is, the feedback resistor Rf can be configured by the user via the differential programmable gain amplifier based on the selected calibration resistor. Accordingly, if the first output voltage Vos is ignored, the resistance of the feedback resistor Rf can satisfy Rf<Rc*|VCC/(VSS−VDD)|/2.

In view of the disclosure of the above embodiments, in an embodiment, the differential amplifier circuit can be a transimpedance amplifier (TIA) circuit.

In view of the disclosure of the above embodiments, in an embodiment, the calibration resistor can be a precision resistor. For example, the calibration resistor can have an accuracy of smaller than or equal to one thousandth. Alternatively, the calibration resistor can have an accuracy smaller than or equal to one ten thousandth. In addition, the calibration resistance can have a temperature drift smaller than or equal to 10 ppm/° C. 10 ppm/° C. means that the accuracy changes 10 ppm (10 parts per million) for every 1° C. temperature change, where parts per million (ppm) means $10^{(-6)}$. For another example, the calibration resistance can have a temperature drift equal to or smaller than 1 ppm/° C. Referring to the disclosure of the above embodiments, since the resistance of the thermistor is related to the resistance of the calibration resistor, and the calibration resistor is unchanged during the second period and the third period, the measurement of the thermistor is the most accurate. Therefore, the measurement accuracy of the thermistor can be improved by configuring the calibration resistor as the precision resistor and limiting its temperature drift and accuracy, thereby improving the accuracy of the temperature measurement.

Figure 3F:
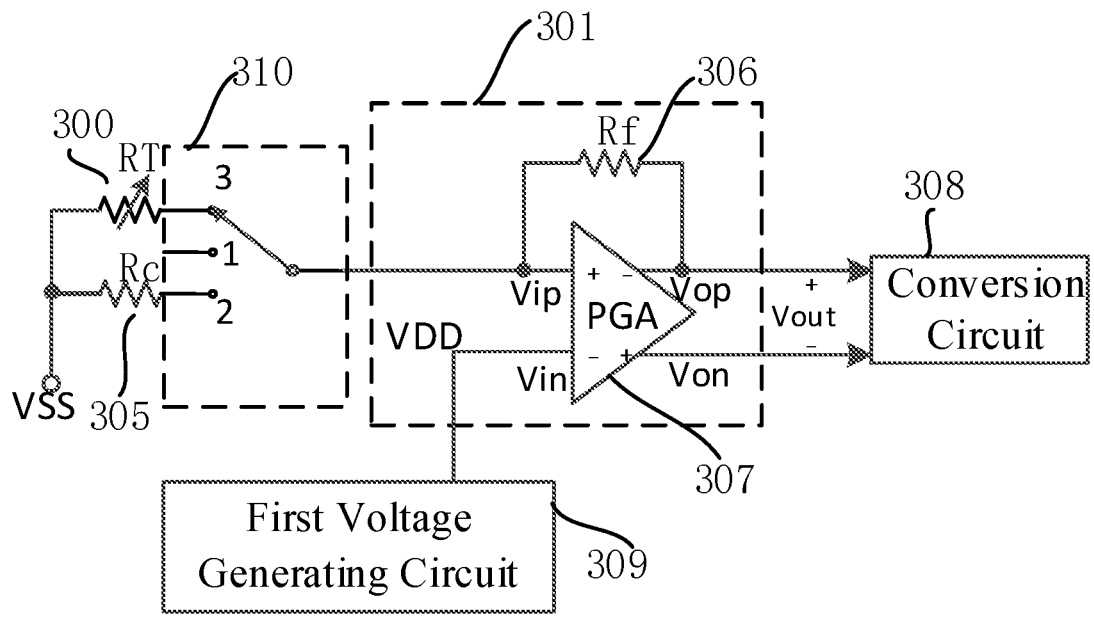
FIG. 3F is a schematic diagram of a still another temperature measurement circuit according to an embodiment of the present disclosure.

In view of the disclosure of the above embodiments, in an embodiment, as shown in FIG. 3A, the first voltage VDD is provided by the differential amplifier circuit 301. It should be understood that the differential amplifier 307 can provide the first voltage VDD, so that the first voltage VDD can be provided to the inverting input terminal of the amplifier circuit. In addition, referring to FIG. 3F, the first voltage VDD can also be provided by a first voltage generating circuit 309. In addition, the second voltage VSS can be provided by a second voltage generating circuit. Alternatively, a power supply module can be provided to generate the first voltage and the second voltage, which will not be repeated herein. The temperature measurement circuit according to this embodiment can also be referred to as a constant voltage driving temperature measurement circuit. The constant voltage source can provide the first voltage such as the common mode voltage through a constant voltage source driving. In this embodiment, the input signals of the differential amplifier are differential signals Vin and Vip, and the outputs thereof are differential signals Von and Vop, where Vin is the first voltage VDD.

In view of the disclosure of the above embodiments, an embodiment also provides a temperature and light intensity measurement circuit which is configured to measure temperature and light intensity. The temperature and light intensity measurement circuit includes the temperature measurement circuit described in any one of the above embodiments. The non-inverting input terminal of the differential amplifier circuit is unloaded or connected to the thermistor, the calibration resistor, or a photodiode, the photodiode is configured to convert a light intensity signal of the measured object to a current signal. When the non-inverting input terminal of the differential amplifier circuit is connected to the photodiode, the differential amplifier circuit outputs a light intensity measurement voltage. The conversion circuit is further configured to obtain the light intensity signal of the measured object based on the light intensity measurement voltage.

Specifically, referring to FIG. 7A, the temperature and light intensity measurement circuit includes the temperature measurement circuit described in any one of the above embodiments. In addition, the temperature and light intensity measurement circuit can further include a photodiode (PD). Specifically, temperature and light intensity measurement circuit can also include a plurality of photodiodes. 711. A current flowing through the photodiode is represented by Ipd. The plurality of photodiodes 711 can be connected in series or in parallel. In addition, the temperature and light intensity measurement circuit can include no photodiode. That is, the photodiode can be connected to the temperature and light intensity measurement circuit as a peripheral. In this way, the user can choose the photodiode to be connected to the temperature and light intensity measurement circuit as desired. In this embodiment, the photodiode is configured to convert the light intensity signal of the measured object to the current signal. Like a common diode, the photodiode is also a semiconductor device composed of a PN junction and also has unidirectional conductivity. However, the photodiode is used as photoelectric sensor device to convert an optical signal to an electrical signal, rather than for rectification, in the circuit. The switch circuit 710 includes at least one switch unit, so that the non-inverting input terminal of the differential amplifier 707 is connected to a front stage of the photodiode 711 in a fourth period. At this time, the differential amplifier circuit 701 outputs the light intensity measurement voltage. For convenience of expression, the light intensity measurement voltage can also be referred to as a fourth output voltage. Thereafter, the conversion circuit 708 can obtain the light intensity signal based on the fourth output voltage. In addition, after the light intensity signal is obtained by the conversion circuit, the conversion circuit can also output the light intensity signal. Specifically, after the contact of the switch circuit 710 is connected to the contactor 4, the front stage of the photodiode is connected to the non-inverting input terminal of the differential amplifier. At this time, the fourth output voltage Vout output after Ipd is amplified by the differential amplifier is recorded as Vp, then Vp=Ipd*2Rf, where 2Rf is an amplification factor of the differential amplifier circuit on the current Ipd. The conversion circuit can calculate the light intensity based on the value of Vp. Similarly, the analog-to-digital converter 703 converts the Vout to the digital signal, and the control circuit 704 processes the digital signal to obtain the light intensity signal and then outputs the light intensity signal to the display for displaying. The thermistor 700, the calibration resistor 705, the differential amplifier circuit 701, the analog-to-digital converter 703, and the control circuit 704 in this embodiment are the same as or similar to those described in the above embodiments, and the detail description thereof will not be repeated herein. It should be understood that in this embodiment, the temperature can be measured firstly, or the light intensity can be measured firstly. Alternatively, the light intensity can be measured firstly, and then the temperature is measured. The specific physical quantity to be measured and how often the measurement is performed is determined by the user as desired. In addition, the light intensity signal obtained by the measurement can be further processed by the control circuit MCU to obtain a heart rate signal or a blood oxygen signal, and the heart rate signal or the blood oxygen signal is finally output by an output circuit. The output circuit can be connected to the control circuit. The conversion circuit can include the output circuit. Specifically, the output circuit can be connected to the MCU. The output circuit can include the display and/or a voice output circuit. The temperature and light intensity measurement circuit according to the embodiments of the disclosure can measure the temperature and the light intensity with fewer components. When measuring the temperature, the switch circuit, the differential amplifier circuit, and the conversion circuit can be used to measure the temperature. When measuring the light intensity, the switch circuit, the differential amplifier circuit, and the conversion circuit can be used to measure the light intensity. It should be understood that at least one part of the circuit is reused for the temperature measurement and the light intensity measurement, so that the cost is greatly reduced. Specifically, the temperature measurement circuit and the light intensity measurement circuit can reuse the differential amplifier circuit, the analog-to-digital conversion circuit, and the control circuit. In a temperature measurement mode, the differential amplifier circuit, the analog-to-digital conversion circuit, and the control circuit of the temperature and light intensity measurement circuit perform the temperature measurement. In a light intensity measurement mode, the differential amplifier circuit, the analog-to-digital conversion circuit and the control circuit of the temperature and light intensity measurement circuit perform light intensity measurement.

In view of the disclosure of the above embodiments, in an embodiment, the control circuit 704 can also be connected to the switch circuit 710 to control the switch unit in the switch circuit 710 to be turned on or turned off to achieve the temperature measurement. Alternatively, a switch control circuit can be additionally provided, and the switch control circuit is connected to the switch circuit to control ON and OFF timing of the switch circuit, thereby realizing the temperature measurement.

In view of the disclosure of the above embodiments, in an embodiment, as shown in FIG. 7A, a rear stage of the photodiode 711 is connected to the second voltage VSS. Specifically, the second voltage can also be GND.

In view of the disclosure of the above embodiments, in an embodiment, referring to FIG. 7B, the conversion circuit 708 includes a current determiner 713 and a light intensity determiner 712 connected to the current determiner 713.

The current determiner 713 is configured to output the current signal flowing through the photodiode based on the fourth output voltage. The light intensity determiner 712 is configured to output the light intensity signal based on the current signal flowing through the photodiode. In an embodiment, the current determiner can directly process the fourth output voltage. Alternatively, in combination with the above embodiments, the control circuit 704 can include the current determiner 713 and the light intensity determiner 712. The analog-to-digital converter 703 can be connected to the current determiner 713. The current determiner can process the fourth output voltage converted by the analog-to-digital converter. For example, if the analog-to-digital converter 703 converts the fourth output voltage to a digital light intensity measurement voltage which can also be referred to as the fourth output signal for convenience of expression, the current determiner 713 processes the fourth output signal to obtain the current signal flowing through the photodiode. The light intensity determiner is configured to obtain the light intensity signal based on the current signal flowing through the photodiode. In addition, the intensity determiner can be configured to output the light intensity signal, or an output module is connected to the rear stage of the light intensity determiner to display the light intensity signal. Specifically, the light intensity signal can be displayed in a form of electronic display or voice output, etc. In addition, the analog-to-digital converter 703 can also be disposed between the current determiner and the light intensity determiner. Specifically, the current determiner outputs the current signal flowing through the photodiode based on the fourth output voltage, and a digital-to-analog conversion is performed on the current signal by the analog-to-digital converter to obtain the digital current signal. The light intensity determiner is configured to process the digital current signal and output the light intensity signal. In this embodiment, the light intensity determiner can obtain the light intensity based on a corresponding relationship between a magnitude of the current signal and a magnitude of the light intensity.

In view of the disclosure of the above embodiments, in an embodiment, the current determiner includes a third divider configured to calculate the current signal that is the fourth output voltage divided by twice the resistance of the feedback resistor. In an embodiment, the current determiner can further include a third multiplier for calculating twice the resistance of the feedback resistor.

In view of the disclosure of the above embodiments, in an embodiment, as shown in FIG. 8, a method for measuring light intensity by the temperature and light intensity measurement circuit includes:

S801: during the fourth period, connecting the non-inverting input terminal of the differential amplifier to the front stage of the photodiode in such a manner that the differential amplifier circuit outputs the fourth output voltage during the fourth period; and S802: outputting the light intensity signal by the conversion circuit based on the fourth output voltage.

In view of the disclosure of the above embodiments, in an embodiment, further referring to FIG. 9, determining the current flowing through the photodiode based on the fourth output voltage can include:

S901: determining the current flowing through the photodiode based on the fourth output voltage; and S902: outputting the light intensity signal based on the current flowing through the photodiode.

In view of the disclosure of the above embodiments, in an embodiment, determining the current flowing through the photodiode based on the fourth output voltage includes: calculating the current flowing through the photodiode that is the fourth output voltage divided by twice the resistance of the feedback resistor. According to the disclosure of the above embodiments, since $Vp=Ipd*2Rf$, thus $Ipd=Vp/(2*Rf)$.

An embodiment of the present disclosure provides a chip that includes the temperature measurement circuit as described in the above embodiments or the temperature and light intensity measurement circuit as described in the above embodiments. The chip according to this embodiment can obtain the temperature signal based on the first output voltage output by the differential amplifier circuit when the non-inverting input terminal of the differential amplifier is unloaded, the second output voltage output by the differential amplifier circuit when the non-inverting input terminal of the differential amplifier is connected to the first terminal of the calibration resistor, and the third output voltage output by the differential amplifier circuit when the non-inverting input terminal of the differential amplifier is connected to the first terminal of the thermistor, so that the accuracy of the temperature measurement in the prior art is improved. In addition, the specific implementation of the improvement has been described in the above embodiments, and will not be repeated herein.

An embodiment of the present disclosure provides a module including the chip as described in the above embodiments. The chip is connected to a substrate. The substrate can be a printed circuit board (PCB) or a flexible printed circuit board (FPC). In addition, the module further includes the thermistor and the calibration resistor. In addition, the module can further include the photodiode. The module according to the embodiment can obtain the temperature signal based on the first output voltage output by the differential amplifier circuit when the non-inverting input terminal of the differential amplifier is unloaded, the second output voltage output by the differential amplifier circuit when the non-inverting input terminal of the differential amplifier is connected to the first terminal of the calibration resistor, and the third output voltage output by the differential amplifier circuit when the non-inverting input terminal of the differential amplifier is connected to the first terminal of the thermistor, so that the accuracy of the temperature measurement in the prior art is improved. In addition, the specific implementation of the improvement has been described in the above embodiments, and will not be repeated herein.

An embodiment of the present disclosure provides an electronic device including a housing and the chip as described in the above embodiments. The chip is disposed in the housing. Specifically, the electronic device includes portable devices such as bracelets, watches, mobile phones, and electronic thermometers. The electronic device according to this embodiment can obtain the temperature signal based on the first output voltage output by the differential amplifier circuit when the non-inverting input terminal of the differential amplifier is unloaded, the second output voltage output by the differential amplifier circuit when the non-inverting input terminal of the differential amplifier is connected to the first terminal of the calibration resistor, and the third output voltage output by the differential amplifier circuit when the non-inverting input terminal of the differential amplifier is connected to the first terminal of the thermistor, so that the accuracy of the temperature measurement in the prior art is improved. In addition, the specific implementation of the improvement has been described in the above embodiments, and will not be repeated herein.

An embodiment of the present disclosure provides a temperature measurement method suitable for a temperature measurement circuit including a differential amplifier circuit and a conversion circuit. Specifically, referring to FIG. 10. the temperature measurement method includes:

S1001: unloading a non-inverting input terminal of the differential amplifier circuit, or connecting the non-inverting input terminal of the differential amplifier circuit to a thermistor or a calibration resistor; and S1002: obtaining, by the conversion circuit, a temperature signal of the measured object based on an output voltage when the non-inverting input terminal of the differential amplifier circuit is unloaded, an output voltage when the non-inverting input terminal of the differential amplifier circuit is connected to the thermistor, and an output voltage when the non-inverting input terminal of the differential amplifier circuit is connected to the calibration resistor.

In this embodiment, the thermistor is configured to convert the temperature signal of the measured object to a resistance signal. In the temperature measurement method according to this embodiment, the temperature signal is obtained based on an offset voltage output by the differential amplifier circuit when the non-inverting input terminal of the differential amplifier is unloaded, a calibration voltage output by the differential amplifier circuit when the non-inverting input terminal of the differential amplifier is connected to the first terminal of the calibration resistor, and a temperature measurement voltage output by the differential amplifier circuit when the non-inverting input terminal of the differential amplifier is connected to the first terminal of the thermistor, so that the accuracy of the temperature measurement in the prior art is improved. In addition, the specific implementation of the improvement has been described in the above embodiments, and will not be repeated herein.

In view of the disclosure of the above embodiment, in this embodiment, when the differential amplifier circuit is unloaded, the differential amplifier circuit outputs the offset voltage. When the non-inverting input terminal of the differential amplifier circuit is connected to the calibration resistor, the differential amplifier circuit outputs the calibration voltage. When the non-inverting input terminal is connected to the thermistor, the differential amplifier circuit outputs the temperature measurement voltage. After the offset voltage, the calibration voltage, and the temperature measurement voltage are obtained through the measurement, the conversion circuit can obtain the temperature of the measured object based on the offset voltage, the calibration voltage, and the temperature measurement voltage signal. Specifically, referring to FIG. 4, the non-inverting input terminal of the differential amplifier circuit can be unloaded during the first period, is connected to the calibration resistor during the second period, and is connected to the thermistor during the third period. In this way, the offset voltage can be measured during the first period, the calibration voltage can be measured during the second period, and the temperature measurement voltage can be measured during the third period. After obtaining the temperature signal of the measured object based on the offset voltage, the calibration voltage and the temperature measurement voltage, the conversion circuit can also output the temperature signal.

In view of the disclosure of the above embodiment, in an embodiment, the first period, the second period and the third period are continuous in time. That is, the three steps including unloading the non-inverting input terminal of the differential amplifier circuit, connecting the non-inverting input terminal of the differential amplifier circuit to the calibration resistor, and connecting the non-inverting input terminal of the differential amplifier circuit to the thermistor can be performed one after another. In this way, there is no time interval between any two adjacent steps of these three steps, or the time interval can be ignored to ensure the time duration required for measuring the offset voltage, the calibration voltage, and the temperature measurement voltage, so that the measurement can be completed in a shorter time duration. In addition, in the shorter time duration, the state of the circuit is unlikely to be changed significantly and instantaneously. Thus, the temperature measured in the shorter time duration can ensure the real-time and accuracy of the temperature measurement. In addition, the sum of the first period, the second period, and the third period is shorter than or equal to the first preset time duration. That is, the offset voltage, the calibration voltage, and the temperature measurement voltage are measured within the first preset time duration. It is further possible to ensure the real-time temperature measurement by setting the first preset time duration. In addition, the third period is longer than or equal to the second preset time duration. That is, the time duration for measuring the temperature measurement voltage cannot be too short. For example, if the temperature is suddenly changed in a short time, the thermistor can still be in a stage of the changing of the resistance. Therefore, the third period is set to be longer than or equal to the second preset time duration, so that the resistance of the thermistor can be changed as the temperature is changed, which results in more accurate temperature measurement. In addition, the first preset time duration is set to be 30 microseconds. In this way, the temperature measurement can be achieved within 30 microseconds, so as to avoid a long time and the poor experience. In addition, the second preset time duration can be 1 microsecond, so that the temperature measurement voltage can be obtained within at least 1 microsecond, so as to capture the resistance change of the thermistor as much as possible. In view of the disclosure of the above embodiments, in an embodiment, referring to FIG. 11, obtaining the temperature signal of the measured object based on the offset voltage, the calibration voltage, and the temperature measurement voltage includes:

S1101: determining the resistance of the thermistor based on the offset voltage, the calibration voltage, and the temperature measurement voltage; and S1102: determining the temperature of the measured object based on the resistance of the thermistor.

In this embodiment, after the temperature of the measured object is determined, the temperature of the measured object can also be output. Specifically, the conversion circuit can be used to output the temperature of the measured object. Alternatively, an additional output circuit can be used to output the temperature of the measured object.

In view of the disclosure of the above embodiments, in an embodiment, referring to FIG. 12, determining the resistance of the thermistor based on the offset voltage, the calibration voltage, and the temperature measurement voltage includes:

S1201: calculating a first difference and a second difference, where the first difference is a difference between the calibration voltage and the offset voltage, and the second difference is a difference between the temperature measurement voltage and the offset voltage;

S1202: calculating a first product that is a product of the first difference and the resistance of the calibration resistor; and S1203: calculating the resistance of the thermistor, where the resistance of the thermistor is the first product divided by the second difference.

In view of the disclosure of the above embodiments, in an embodiment, referring to FIG. 13, the temperature measurement method further includes:

S1301: performing an analog-to-digital conversion on each of the offset voltage, the calibration voltage, and the temperature measurement voltage; and S1302: determining the resistance of the thermistor based on the analog-to-digital converted offset voltage, the analog-to-digital converted calibration voltage, and the analog-to-digital converted temperature measurement voltage.

An embodiment of the present disclosure provides a temperature and light intensity measurement method applicable to a temperature and light intensity measurement circuit including a differential amplifier circuit and a conversion circuit. Referring to FIG. 14, the temperature and light intensity measurement method includes:

S1401: unloading a non-inverting input terminal of the differential amplifier circuit, or connecting the non-inverting input terminal of the differential amplifier circuit to a thermistor, a calibration resistor, or a photodiode; and S1402: obtaining, by the conversion circuit, a temperature signal of a measured object based on an output voltage when the non-inverting input terminal of the differential amplifier circuit is unloaded, an output voltage when the non-inverting input terminal of the differential amplifier circuit is connected to the thermistor, and the output voltage when the non-inverting input terminal of the differential amplifier circuit is connected to the calibration resistor; and obtaining, by the conversion circuit, a light intensity signal of the measured object based on an output voltage when the non-inverting input terminal of the differential amplifier circuit is connected to the photodiode.

In view of the disclosure of the above embodiments, in an embodiment, referring to FIG. 15, obtaining the light intensity signal of the measured object based on the output voltage when the non-inverting input terminal of the differential amplifier circuit is connected to the photodiode includes:

S1501: determining a current flowing through the photodiode based on a light intensity measurement voltage; and S1502: determining the light intensity based on the current flowing through the photodiode.

In this embodiment, the light intensity is determined by the conversion circuit to obtain the light intensity signal of the measured object. The light intensity is represented in the form of the light intensity signal. Specifically, the conversion circuit can also be configured to output the light intensity signal.

In view of the disclosure of the above embodiments, in an embodiment, determining the current through the photodiode based on the light intensity measurement voltage includes obtaining the current flowing through the photodiode that is the light intensity measurement voltage divided by twice resistance of the feedback resistor of the differential amplifier circuit. That is, the current of the photodiode can be obtained by dividing the light intensity measurement voltage by twice the resistance of the feedback resistor of the differential amplifier circuit, so that the light intensity can be further obtained based on the corresponding relationship between the photodiode current and the light intensity.

An embodiment of the present disclosure provides a chip. Referring to FIG. 16, the chip 1600 includes a memory 1601 and a processor 1602. The memory is coupled with the processor. The memory is configured to store program instructions. The processor is configured to call the program instructions that cause the chip to perform the temperature measurement method or the temperature and light intensity measurement method as described in any one of the above embodiments. Specifically, the chip can be connected to the temperature measurement circuit including the differential amplifier circuit and the conversion circuit, to for example control the connection state of the non-inverting input terminal of the differential amplifier circuit in the temperature measurement circuit, so as to implement the temperature measurement method or the temperature and light intensity measurement method. In an embodiment, the thermistor is configured to convert the temperature signal of the measured object to a resistance signal.

It should be noted that the method as described in the above embodiments of the present disclosure can be applied to a processor or implemented by the processor. The processor can be an integrated circuit chip with signal processing capabilities. In the implementation process, the steps of the method as described in the above embodiments can be completed by hardware integrated logic circuits or software instructions in the processor. The processor can be a general-purpose processor, a digital signal processor (DSP), an application specific integrated circuit (ASIC), a field programmable gate array (FPGA) or other programmable logic devices, discrete gates, or transistor logic devices, discrete hardware components. The methods, steps and logical block diagrams that are disclosed in the embodiments of the present disclosure can be implemented or performed. The general-purpose processor can be a microprocessor, or the processor can also be any conventional processor or the like. The steps of the method disclosed in the embodiments of the present disclosure can be directly embodied as being executed and completed by a hardware decoding processor, or executed and completed by a combination of hardware and software modules in the decoding processor. The software module can be located in a storage medium well-known in the art, such as a random access memory, a flash memory, a read-only memory, a programmable read-only memory, an electrically erasable programmable memory, a register and the like. The storage medium is located in the memory, and the processor reads the information in the memory and completes the steps of the above method in combination with the hardware thereof.

It should be understood that the memory in the embodiments of the present disclosure can be a volatile memory or a non-volatile memory, or can include both the volatile and the non-volatile memory. In addition, the non-volatile memory can be a read-only memory (ROM), a programmable read-only memory (PROM), an erasable programmable read-only memory (EPROM), and an electrically programmable read-only memory (EEPROM) or a flash memory. The volatile memory can be a random access memory (RAM), which is used as an external cache. By way of exemplary rather than limiting description, many RAM can be used, such as a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM). It should be noted that the memory of the system and method described herein is intended to include, but are not limited to, these and any other suitable types of memories.

It should be understood that in the embodiments of the present disclosure, "B corresponding to A" means that B is associated with A, and B can be determined based on A. However, it should also be understood that determining B based on A does not mean that B is determined only based on A, and B can also be determined based on A and/or other information.

In addition, the term "and/or" used herein is only an association relationship for describing associated objects, which means that there are three types of relationships. For example, A and/or B may include three cases including A alone, A and B, and B alone. In addition, the character "/" used herein generally indicates that the associated objects before and after are in an "or" relationship.

It should be understood by those ordinary skilled in the art that the units and algorithm steps in the example described in combination with the embodiments disclosed herein can be implemented by the electronic hardware or a combination of the computer software and the electronic hardware. Implementing these functions by the hardware or the software depends on the specific application and design constraint conditions of the technical solution. Those skilled in the art can employ different methods for each specific application to implement the described functions, and such implementation should not be considered beyond the scope of this disclosure.

Those skilled in the art may clearly understand that, for the convenience and conciseness of description, the specific operating process of the system, the device, and the unit as described above can refer to the corresponding process in the method as described in the above embodiment, and the detail description will be omitted herein.

In the several embodiments of this disclosure, it should be understood that the disclosed system, device, and method can be implemented in other ways. For example, the device as described above is only illustrative. For example, the division of the units is only a logical function division, and there may be other divisions in the actual implementation. For example, a plurality of units or components can be combined or integrated into another system, or some of the features may be ignored or not implemented. In addition, the displayed or discussed mutual coupling, direct coupling or communication connection can be an indirect coupling or communication connection of the devices and the units through some interfaces, and may be in electrical, mechanical or other forms.

The units described as separate components can be or can be not physically separated, and the components displayed as the units can be or can be not physical units. That is, they can be located in one place, or they can be distributed on a plurality of network units. Some or all of the units can be selected as desired to achieve the objectives of the solutions of the embodiments.

In addition, the functional units in the various embodiments of the present disclosure can be integrated into one processing unit. Alternatively, each unit can exist alone physically, or two or more units can be integrated into one unit.

If the function is implemented in the form of a software functional unit and sold or used as an independent product, it can be stored in a computer readable storage medium. Based on this understanding, the technical solution of the present disclosure essentially can be embodied in the form of a software product, or the part that contributes to the related art or the part of the technical solution can be embodied in the form of the software product, and the computer software product is stored in a storage medium including several instructions to allow a computer device (which can be a personal computer, a server, or a network device, etc.) perform all or part of the steps of the methods described in the various embodiments of the present disclosure. The storage media include a U disk, a mobile hard disk, a read-only memory (ROM), a random access memory (RAM), a magnetic disk, an optical disk, or other media that can store program codes.

The above are only some embodiments of the present disclosure, and are not intended to limit the present disclosure. Any skilled in the art may easily conceive that changes or substitutions within the scope of the present disclosure shall fall within the scope of the disclosure. Therefore, the scope of present disclosure should be defined by the claims.

What is claimed is:

1. A temperature measurement circuit, comprising:
   an unloaded contactor;
   a differential amplifier circuit, wherein a non-inverting input terminal of the differential amplifier circuit is selectively connected to one of the following components: the unloaded contactor, a thermistor and a calibration resistor, and the thermistor is configured to convert a temperature signal of a measured object to a resistance signal; and
   a conversion circuit connected to the differential amplifier circuit,
   wherein in a first period, the non-inverting input terminal of the differential amplifier circuit is connected to the unloaded contactor, and the differential amplifier circuit outputs an offset voltage,
   in a second period, the non-inverting input terminal of the differential amplifier circuit is connected to the calibration resistor, and the differential amplifier circuit outputs a calibration voltage, and
   in a third period, the non-inverting input terminal of the differential amplifier circuit is connected to the thermistor, and the differential amplifier circuit outputs a temperature measurement voltage of the measured object; and
   wherein the conversion circuit is configured to obtain the temperature signal of the measured object based on the offset voltage, the calibration voltage, and the temperature measurement voltage.

2. The temperature measurement circuit according to claim 1, wherein the conversion circuit comprises: a first resistance determiner configured to output a resistance signal of the thermistor based on the offset voltage, the calibration voltage, and the temperature measurement voltage;
   a first temperature determiner connected to the first resistance determiner and configured to convert the resistance signal to the temperature signal; and a first analog-to-digital converter connected to both the first resistance determiner and the first temperature determiner, and configured to convert the resistance signal to a digital resistance signal, wherein the first temperature determiner is further configured to convert the digital resistance signal to the temperature signal; or the conversion circuit further comprises: a second analog-to-digital converter configured to perform analog-to-digital conversion on the offset voltage, the calibration voltage, and the temperature measurement voltage to obtain a digital offset voltage, a digital calibration voltage, and a digital temperature measurement voltage, respectively; and a control circuit connected to the second analog-to-digital converter and configured to convert the digital offset voltage, the digital calibration voltage, and the digital temperature measurement voltage to the temperature signal; and the control circuit comprises:

a second resistance determiner configured to convert the digital offset voltage, the digital calibration voltage and the digital temperature measurement voltage to a digital resistance signal of thermistor; and a second temperature determiner connected to the second resistance determiner and configured to convert the digital resistance signal to the temperature signal.

3. The temperature measurement circuit according to claim 2, wherein the first resistance determiner comprises:

a first subtractor configured to calculate a first difference and a second difference, the first difference being a difference between the calibration voltage and the offset voltage, and the second difference being a difference between the temperature measurement voltage and the offset voltage;

a first multiplier configured to calculate a first product, the first product being a product of the first difference and a resistance of the calibration resistor; and a first divider configured to calculate the resistance signal, the resistance signal being the first product divided by the second difference.

4. The temperature measuring circuit according to claim 1, wherein an inverting input terminal of the differential amplifier circuit is connected to a first voltage; a second terminal of the thermistor is supplied with a second voltage; a second terminal of the calibration resistor is supplied with the second voltage; and the second voltage is greater than or smaller than the first voltage; and the differential amplifier circuit further comprises a feedback resistor and a differential amplifier, wherein the feedback resistor is a non-sensitive resistor, and two terminals of the feedback resistor are connected to a non-inverting input terminal and an inverting output terminal of the differential amplifier, respectively; and wherein in the first period, the non-inverting input terminal of the differential amplifier is connected to the unloaded contactor, and the differential amplifier outputs the offset voltage;

in the second period, the non-inverting input terminal of the differential amplifier is connected to a first terminal of the calibration resistor, and the differential amplifier outputs the calibration voltage; and in the third period, the non-inverting input terminal of the differential amplifier is connected to a first terminal of the thermistor, and the differential amplifier outputs the temperature measurement voltage.

5. The temperature measuring circuit according to claim 4, wherein a resistance of the calibration resistor is greater than a product of twice a resistance of the feedback resistor multiplied by a first preset absolute value, and the first preset absolute value is an absolute value of a quotient of a difference between the first voltage and the second voltage divided by a power supply voltage.

6. The temperature measurement circuit according to claim 4, wherein a gain of the differential amplifier circuit is 0 when the non-inverting input terminal of the differential amplifier is connected to the unloaded contactor;

the gain of the differential amplifier circuit is twice a resistance of the feedback resistor divided by a resistance of the calibration resistor when the non-inverting input terminal of the differential amplifier is connected to the first terminal of the calibration resistor; and the gain of the differential amplifier circuit is twice the resistance of the feedback resistor divided by the resistance of the thermistor when the non-inverting input terminal of the differential amplifier is connected to the first terminal of the thermistor.

7. The temperature measurement circuit according to claim 4, wherein the second voltage is a ground voltage; the first voltage is a common mode voltage; and a resistance of the feedback resistor is smaller than a resistance of the calibration resistor.

8. The temperature measurement circuit according to claim 1, wherein the thermistor and the calibration resistor are connected to a switch circuit connected to the differential amplifier circuit; and the switch circuit comprises at least one switch unit.

9. The temperature measurement circuit according to claim 8, wherein the switch circuit comprises a first switch unit and a second switch unit;

the non-inverting input terminal of the differential amplifier circuit is unloaded when the first switch unit and the second switch unit are both in an OFF state;

the non-inverting input terminal of the differential amplifier circuit is connected to the first terminal of the calibration resistor when the first switch unit is in an ON state; and the non-inverting input terminal of the differential amplifier circuit is connected to the first terminal of the thermistor when the second switch unit is in an ON state.

10. The temperature measurement circuit according to claim 1, wherein the calibration resistor is a precision resistor, a temperature drift of the calibration resistor is smaller than or equal to 10 ppm/° C., and a precision of the calibration resistor is smaller than or equal to one thousandth.

11. A temperature and light intensity measurement circuit, comprising the temperature measurement circuit according to claim 1, wherein the non-inverting input terminal of the differential amplifier circuit is selectively connected to one of the following components: the unloaded contactor, the thermistor, the calibration resistor, and a photodiode, and the photodiode is configured to convert a light intensity signal of the measured object to a current signal;

the differential amplifier circuit is configured to output a light intensity measurement voltage when the non-inverting input terminal of the differential amplifier circuit is connected to the photodiode; and the conversion circuit is further configured to obtain the light intensity signal of the measured object based on the light intensity measurement voltage.

12. The temperature and light intensity measurement circuit according to claim 11, wherein the non-inverting input terminal of the differential amplifier circuit is connected to a cathode of the photodiode when the non-inverting input terminal of the differential amplifier circuit is connected to the photodiode, and an anode of the photodiode is connected to a second voltage that is a ground voltage.

13. A chip comprising a temperature measurement circuit, wherein the temperature measurement circuit comprising:
- an unloaded contactor;
- a differential amplifier circuit, wherein a non-inverting input terminal of the differential amplifier circuit is selectively connected to one of the following components: the unloaded contactor, a thermistor and a calibration resistor, and the thermistor is configured to convert a temperature signal of a measured object to a resistance signal; and
- a conversion circuit connected to the differential amplifier circuit,
- wherein in a first period, the non-inverting input terminal of the differential amplifier circuit is connected to the unloaded contactor, and the differential amplifier circuit outputs an offset voltage,
- in a second period, the non-inverting input terminal of the differential amplifier circuit is connected to the calibration resistor, and the differential amplifier circuit outputs a calibration voltage, and
- in a third period, the non-inverting input terminal of the differential amplifier circuit is connected to the thermistor, and the differential amplifier circuit outputs a temperature measurement voltage of the measured object; and
- wherein the conversion circuit is configured to obtain the temperature signal of the measured object based on the offset voltage, the calibration voltage, and the temperature measurement voltage.

14. A module comprising a substrate, the thermistor, the calibration resistor and the chip according to claim 13, the chip is connected to the substrate.

15. An electronic device comprising a housing, a thermistor, a calibration resistor and a chip disposed in the housing, wherein the thermistor is configured to convert a temperature signal of a measured object to a resistance signal, wherein the chip comprising a temperature measurement circuit, wherein the temperature measurement circuit comprises:
- an unloaded contactor;
- a differential amplifier circuit, wherein a non-inverting input terminal of the differential amplifier circuit is selectively connected to one of the following components: the unloaded contactor, a thermistor and a calibration resistor; and
- a conversion circuit connected to the differential amplifier circuit,
- wherein in a first period, the non-inverting input terminal of the differential amplifier circuit is connected to the unloaded contactor, and the differential amplifier circuit outputs an offset voltage,
- in a second period, the non-inverting input terminal of the differential amplifier circuit is connected to the calibration resistor, and the differential amplifier circuit outputs a calibration voltage, and
- in a third period, the non-inverting input terminal of the differential amplifier circuit is connected to the thermistor, and the differential amplifier circuit outputs a temperature measurement voltage of the measured object; and
- wherein the conversion circuit is configured to obtain the temperature signal of the measured object based on the offset voltage, the calibration voltage, and the temperature measurement voltage.

16. The temperature measurement circuit according to claim 1, wherein the first period, the second period, and the third period are continuous in time; a sum of the first period, the second period, and the third period is shorter than or equal to a first preset time duration; and the third period is longer than or equal to a second preset time duration.

17. The temperature measurement circuit according to claim 16, wherein a time duration of each of the first period, the second period, and the third period is shorter than or equal to 10 microseconds.

18. The temperature measurement circuit according to claim 1, further comprising a switch including a first input, a second input, a third input, and an output, wherein the first input is connected to the unloaded contactor, the second input is connected to the thermistor, the third input is connected to the calibration resistor, and the output is connected to the non-inverting input terminal of the differential amplifier circuit.

19. The temperature measurement circuit according to claim 1, wherein in the first period, a voltage at the non-inverting input terminal of the differential amplifier circuit is equal to a voltage at an inverting input terminal of the differential amplifier circuit.

20. The temperature measurement circuit according to claim 1, wherein in the second period, an inverting input terminal of the differential amplifier circuit is connected to a first voltage, the non-inverting input terminal of the differential amplifier circuit is connected to a first terminal of the calibration resistor, and a second terminal of the calibration resistor is connected to a second voltage different from the first voltage,
- in the third period, the inverting input terminal of the differential amplifier circuit is connected to the first voltage, the non-inverting input terminal of the differential amplifier circuit is connected to a first terminal of the thermistor, and a second terminal of the thermistor is connected to the second voltage.

* * * * *